United States Patent
Yamazaki et al.

(10) Patent No.: US 6,835,586 B2
(45) Date of Patent: Dec. 28, 2004

(54) SEMICONDUCTOR DEVICE AND MANUFACTURING METHOD THEREOF

(75) Inventors: Shunpei Yamazaki, Tokyo (JP); Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/837,558

(22) Filed: Apr. 19, 2001

(65) Prior Publication Data

US 2002/0139978 A1 Oct. 3, 2002

(30) Foreign Application Priority Data

Dec. 25, 1998 (JP) .......................................... 10-370541

(51) Int. Cl.⁷ .............................................. H01L 21/00
(52) U.S. Cl. .......................... 438/48; 257/59; 257/69; 257/72
(58) Field of Search .................... 438/48, 128, 149, 438/151; 257/69, 59, 72

(56) References Cited

U.S. PATENT DOCUMENTS

| | | | |
|---|---|---|---|
| 4,609,930 A | 9/1986 | Yamazaki | |
| 4,748,485 A | 5/1988 | Vasudev | |
| 4,977,105 A | 12/1990 | Okamoto et al. | |
| 4,984,033 A | 1/1991 | Ishizu et al. | |
| 4,996,575 A | 2/1991 | Ipri et al. | |
| 5,034,788 A | 7/1991 | Kerr | |
| 5,103,277 A | 4/1992 | Caviglia et al. | |
| 5,124,769 A | 6/1992 | Tanaka et al. | |
| 5,140,391 A | 8/1992 | Hayashi et al. | |
| 5,185,535 A | 2/1993 | Farb et al. | |
| 5,198,379 A | 3/1993 | Adan | |
| 5,233,211 A | 8/1993 | Hayashi et al. | |
| 5,246,882 A | 9/1993 | Hartmann | |
| 5,273,921 A | 12/1993 | Neudeck et al. | |
| 5,275,972 A | 1/1994 | Ogawa et al. | |
| 5,281,840 A | 1/1994 | Sarma | |
| 5,294,821 A | 3/1994 | Iwamatsu | |

(List continued on next page.)

FOREIGN PATENT DOCUMENTS

| | | |
|---|---|---|
| EP | 0 178 447 | 4/1986 |
| JP | 57-032641 | 2/1982 |

(List continued on next page.)

OTHER PUBLICATIONS

Farrah et al., "Analysis of Double–Gate Thin–Film Transistor", pp. 69–74, Feb. 1967, IEEE Transactions on Electron Devices, vol. ED–14, No. 2.

(List continued on next page.)

Primary Examiner—Long Pham
Assistant Examiner—Nathan W. Ha
(74) Attorney, Agent, or Firm—Nixon Peabody LLP; Jeffrey L. Costellia

(57) ABSTRACT

Providing a semiconductor device with a TFT structure with high reliability

In a CMOS circuit formed on a substrate 100, a subordinate gate wiring line (a first wiring line) 102*a* and main gate wiring line (a second wiring line) 107*a* is provided in an n-channel TFT. The LDD regions 113 overlaps the first wiring line 102*a* and does not overlap the second wiring line 107*a*. Thus, applying a gate voltage to the first wiring line forms the GOLD structure, while not applying forms the LLD structure. In this way, the GOLD structure and the LLD structure can be used appropriately in accordance with the respective specifications required for the circuits.

20 Claims, 19 Drawing Sheets

U.S. PATENT DOCUMENTS

| | | | |
|---|---|---|---|
| 5,315,132 A | 5/1994 | Yamazaki | |
| 5,327,001 A | 7/1994 | Wakai et al. | |
| 5,359,219 A | 10/1994 | Hwang | |
| 5,371,398 A | 12/1994 | Nishihara | |
| 5,420,048 A | 5/1995 | Kondo | |
| 5,463,483 A | 10/1995 | Yamazaki | |
| 5,470,793 A | 11/1995 | Kalnitsky | |
| 5,475,238 A | 12/1995 | Hamada | |
| 5,485,019 A | 1/1996 | Yamazaki et al. | |
| 5,506,436 A | 4/1996 | Hayashi et al. | |
| 5,521,107 A | 5/1996 | Yamazaki et al. | |
| 5,532,850 A | 7/1996 | Someya et al. | |
| 5,580,802 A | 12/1996 | Mayer et al. | |
| 5,604,368 A | 2/1997 | Taur et al. | |
| 5,621,224 A | 4/1997 | Yamazaki et al. | |
| 5,646,424 A | 7/1997 | Zhang et al. | |
| 5,702,963 A | 12/1997 | Vu et al. | |
| 5,807,772 A | 9/1998 | Takemura | |
| 5,818,076 A | 10/1998 | Zhang et al. | |
| 5,917,221 A | 6/1999 | Takemura | |
| 6,054,734 A | 4/2000 | Aozasa et al. | |
| 6,225,150 B1 | 5/2001 | Lee et al. | |
| 6,323,068 B1 | 11/2001 | Seo | |
| 6,330,044 B1 | 12/2001 | Murade | |
| 6,479,333 B1 * | 11/2002 | Takano et al. | 438/159 |
| 6,603,453 B2 * | 8/2003 | Yamazaki et al. | 345/92 |
| 2001/0030722 A1 | 10/2001 | Murade | |
| 2002/0080295 A1 | 6/2002 | Someya et al. | |
| 2002/0093019 A1 | 7/2002 | Hirabayashi et al. | |
| 2003/0038303 A1 | 2/2003 | Hashimoto et al. | |

FOREIGN PATENT DOCUMENTS

| | | |
|---|---|---|
| JP | 58-115850 | 7/1983 |
| JP | 60-081869 | 5/1985 |
| JP | 60-154660 | 8/1985 |
| JP | 61-067269 | 4/1986 |
| JP | 61-088565 | 5/1986 |
| JP | 61-220371 | 9/1986 |
| JP | 62-005661 | 1/1987 |
| JP | 62-117359 | 5/1987 |
| JP | 64-019761 | 1/1989 |
| JP | 64-053459 | 3/1989 |
| JP | 64-053460 | 3/1989 |
| JP | 64-059866 | 3/1989 |
| JP | 02-015676 | 1/1990 |
| JP | 03-082171 | 4/1991 |
| JP | 03-256365 | 11/1991 |
| JP | 04-152574 | 5/1992 |
| JP | 04-364074 | 12/1992 |
| JP | 02-666293 | 6/1997 |
| JP | 11-354802 | 12/1999 |
| JP | 2000-183356 | 6/2000 |
| JP | 2000-194014 | 7/2000 |
| JP | 2000-196093 | 7/2000 |
| WO | 93/21659 | 10/1993 |

OTHER PUBLICATIONS

Ishii et al., "A Trial Product of Dual–Gate MOS (X MOS) Device", pp. 405, 1985, 46th Japan Society of Applied Physics, 2a–V–9.

Ishii et al., "Experimental Fabrication of XMOS Transistors Using Lateral Solid–Phase Epitaxy of CVD Silicon Films", pp. L521–L523, Apr. 1990, Japanese Journal of Applied Physics, vol. 29, No. 4.

Noguchi et al., "Advanced High Mobility Polysilicon Super–thin Film Transistor (SFT) Using Solid Phase Growth", pp. 549–552, 1986, Extended Abstracts of the 18th International Conference on Solid State Devices and Materials, Tokyo, B–10–2.

Hayashi et al., "Polysilicon Super–Thin–Film Transistor (SFT)", pp. L819–L820, Nov. 1984, Japanese Journal of Applied Physics, vol. 23, No. 11.

Hayashi et al., "High Performance Superthin Film Transistor (SFT) with Twin Gates", pp. 59–62, 1987, Extended Abstracts of the 19th Conference on Solid State Devices and Materials, Tokyo, A–3–5.

Sekigawa et al., "The Development of XMOS Transistor", pp. 44–49, 1986, Semiconductor World.

Tuan et al., "Dual–Gate a–Si:H Thin Film Transistors", pp. 357–359, Dec. 1982, IEEE Electron Device Letters, vol. EDL–3, No. 12.

Specifications and Drawings for patent application Ser. No. 09/837,552, "Semiconductor Device and Manufacturing Method thereof", Filing Date: Apr. 19, 2001, Hishashi Ohtani et al.

Specifications and Drawings for patent application Ser. No. 09/837,877, "Semiconductor Device", Filing Date: Apr. 19, 2001, Shunpei Yamazaki et al., Byeon, Sag Gi et al. "High–Performance Tantalum Oxide Capacitors Fabricated by a Novel Reoxidation Scheme" IEEE Transactions On Electron Devices, vol. 37, No. 4, Apr. 90.

* cited by examiner phosphorus doping step boron doping step back side exposure step    phosphorus doping step phosphorus doping step boron doping step back side exposure step     phosphorus doping step pixel TFT portion    storage capacitor portion pixel TFT portion    storage capacitor portion pixel TFT portion    storage capacitor portion

NTFT   PTFT pixel TFT portion   storage capacitor portion gettering step by phosphorus

NTFT   PTFT 318  320     319    322    323

Phosphorus doping step (n⁻)

Backside exposure step, phosphorus doping step (n⁻)

Boron doping step (p⁺⁺)

Boron doping step (p⁺⁺)

Phosphorus doping step (n⁻)

Backside exposure step, phosphorus doping step (n⁺)

Boron doping step (p++)

Phosphorus doping step (n++)

Phosphorus doping step (n−)

Phosphorus doping step (n⁺)

Phosphorus doping step (n⁻)

Boron doping step (n⁺⁺)

Phosphorus doping step (n⁺)

Boron doping step (p⁺⁺)

Phosphorus doping step (n⁻)

Phosphorus doping step (n⁻)

Phosphorus doping step (n⁻)

pixel TFT portion    Storage capacitor portion

SEMICONDUCTOR DEVICE AND MANUFACTURING METHOD THEREOF

DETAILED DESCRIPTION OF THE INVENTION

1. Technical Field to which the Invention Belongs

The present invention relates to a semiconductor device having a circuit composed of a thin film transistor (hereinafter referred to as TFT). For example, the invention relates to an electro-optical device represented by a liquid crystal display panel and to electronic equipment mounted with the electro-optical device as a component.

In this specification, a semiconductor device refers to a device in general that utilizes semiconductor characteristics to function, and electro-optical devices, semiconductor circuits, and electronic equipment are semiconductor devices.

2. Prior Art

A thin film transistor (hereinafter referred to as TFT) can be formed on a transparent glass substrate, and hence its application to an active matrix liquid crystal display (hereinafter referred to as AM-LCD) has been developed actively. A TFT utilizing a crystalline semiconductor film (typically, a polysilicon film) can provide high mobility, making it possible to integrate functional circuits on the same substrate for high definition image display.

An active matrix liquid crystal display device requires million TFTs for pixels alone when the screen is to have high definition. Its functional circuits also need TFTs to further increase the number of required TFTs. Each of these TFTs has to have secured reliability and operate stably in order to realize stable operation of the liquid crystal display device.

However, the TFT is considered as not so equal in terms of reliability to a MOSFET that is formed on a single crystal semiconductor substrate. The TFT experiences lowering of mobility and ON current when it is operated for a long period of time, as the MOSFET suffers from the same phenomena. One of causes of the phenomena is characteristic degradation due to hot carriers that accompany enlargement of a channel electric field.

The MOSFET, on the other hand, has the LDD (lightly doped drain) structure as a well-known reliability improving technique. This structure adds a low concentration impurity region inside a source drain region. The low concentration impurity region is called an LDD region. Some TFTs employ the LDD structure.

Another known structure for the MOSFET is to make the LDD region somewhat overlap a gate electrode with a gate insulating film sandwiched therebetween. This structure can be obtained in several different modes. For example, structures called GOLD (Gate-drain overlapped LDD) and LATID (Large-tilt-angle implanted drain) are known. The hot carrier withstandingness can be enhanced by these structures.

There have been attempts to apply these structures for MOSFETs to TFTs. However, application of the GOLD structure (in this specification, a structure having an LDD region to which a gate voltage is applied is called a GOLD structure whereas a structure having merely an LDD region to which a gate voltage is not applied is called an LDD structure) to a TFT has a problem of OFF current (current flowing when the TFT is in an OFF state) being larger than in the LDD structure. For that reason, the GOLD structure is not suitable for a circuit in which OFF current should be as small as possible, such as a pixel matrix circuit of an AM-LCD.

[Problems to be Solved by the Invention]

An object of the present invention is to provide an AM-LCD having high reliability by constructing circuits of the AM-LCD from TFTs having different structures to suit the respective functions of the circuits. The invention aims to accordingly enhance the reliability of a semiconductor device (electronic equipment) having this AM-LCD.

[Means for Solving the Problems]

According to a structure of the present invention disclosed in this specification, a semiconductor device including a CMOS circuit formed by n-channel TFT and p-channel TFT, characterized in that:

the CMOS circuit has a structure that an active layer is sandwiched by a first wiring line and a second wiring line through an insulating layer in the n-channel TFT, the active layer includes a low concentration impurity region that is in contact with the channel formation region; and the low concentration impurity region is formed to overlap the first wiring line and not to overlap the second wiring line.

According to another structure of the present invention, a semiconductor device including a CMOS circuit formed by n-channel TFT and p-channel TFT, characterized in that:

the CMOS circuit has a structure that an active layer is sandwiched by a first wiring line and a second wiring line through an insulating layer in the n-channel TFT and the p-channel TFT; and the active layer of the n-channel TFT includes a low concentration impurity region that is in contact with the channel formation region; and the low concentration impurity region is formed to overlap the first wiring line and not to overlap the second wiring line.

In the above structures, the first wiring line of the n-channel TFT is electrically connected with the second wiring line preferably. Thus, a first wiring line and a second wiring line can be in the same electric potential.

In the above structures, the first wiring line and/or the second wiring line can use a conductive film mainly containing an element selected from the group consisting of tantalum (Ta), chromium (Cr), titanium (Ti), tungsten (W), molybdenum (Mo), and silicon (Si), or an alloy film or silicide film containing the above elements in combination. And their films may be use by laminating.

According to another structure of the present invention, a semiconductor device having a pixel matrix circuit that includes a pixel TFT and a storage capacitor formed in n-channel TFT, characterized in that:

the pixel TFT has a structure that an active layer is sandwiched by a first wiring line and a second wiring line through an insulating layer, the active layer includes a low concentration impurity region that is in contact with the channel formation region; and the low concentration impurity region is formed to overlap the first wiring line and not to overlap the second wiring line.

The storage capacitor is formed between the first wiring line, the first insulating layer and the active layer. It can be said that a light-shielding layer is used as an electrode of the storage capacitor because the first wiring line functions as the light-shielding layer. Thus, it is effective for improving the aperture ratio of the pixel to use the wiring line formed below the active layer as an electrode to form the storage capacitor.

The first wiring line may be kept at the floating electric potential, but preferably at the lowest power supply electric potential. This makes it possible to use as a light-shielding layer without influencing on an action of the pixel TFT.

According to another structure of the present invention, a semiconductor device having a pixel matrix circuit and a driver circuit that are formed on the same substrate, characterized in that:

a pixel TFT included in the pixel matrix circuit and an n-channel TFT included in the driver circuit have a structure that an active layer is sandwiched by a first wiring line and a second wiring line through an insulating layer; and the first wiring line connected to the pixel TFT is kept at the lowest power supply electric potential, and the first wiring connected to the n-channel TFT included in the driver circuit is kept at the same level of electric potential as the second wiring line connected to the n-channel TFT included in the said driver circuit.

In the above structures, the active layer includes a low concentration impurity region that is in contact with the channel formation region and the low concentration impurity region is formed to overlap the first wiring line and not to overlap the second wiring line.

According to another structure of the present invention, manufacturing method of a semiconductor device including a CMOS circuit formed by n-channel TFT and p-channel TFT comprising:

a process of forming a first wiring line on a substrate, a process of forming a first insulating layer on the first wiring line, a process of forming active layers, an active layer of the n-channel TFT and an active layer of the p-channel TFT, on the first insulating layer, a process of forming a second insulating layer by overlapping the active layer of n-channel TFT and the active layer of p-channel layer, a process of forming a second wiring line on the second insulating layer, and a process of forming a LDD region on the active layer of the n-channel TFT; and characterized in that the first wiring line is formed to cross only with the active layer of n-channel TFT.

EMBODIMENT MODE OF THE INVENTION

Embodiment Mode 1

An embodiment mode of the present invention will be described taking as an example a CMOS circuit (inverter circuit) in which an n-channel TFT (hereinafter referred to as NTFT) is combined with a p-channel TFT (hereinafter referred to as PTFT).

A sectional structure thereof is shown in FIG. 1A and a top view thereof is shown in FIG. 1B. The description will be given using symbols common to FIG. 1A and FIG. 1B. The sectional views taken along the lines A–A', B–B', and C–C' in FIG. 1B correspond to the sectional views A–A', B–B', and C–C' in FIG. 1A, respectively.

In FIG. 1A, 100 denotes a substrate; 101, a base film; 102a, 102b, and 102c, first wiring lines; 103, a first insulating layer; 104, an active layer of NTFT; 105, an active layer of PTFT; and 106, a second insulating layer.

On that, secoond wiring lines 107a, 107b, 107c and 107d are formed by conductive films. And 108 is a first interlayer insulating layer, 109 to 111 are third wiring lines, 109 and 110 are source wiring lines (including source electrodes), and 111 is a drain wiring line (including a drain electrode).

In the CMOS circuit structured as above, a glass substrate, a quartz substrate, a metal substrate, a stainless steel substrate, a plastic substrate, a ceramic substrate, or a silicon substrate may be used as the substrate 100. When a silicon substrate is used, it is appropriate to oxidize its surface to form a silicon oxide film in advance.

The base film 101 may be an insulating film mainly containing silicon, such as a silicon oxide film, a silicon nitride film, and a silicon oxynitride film. It is also effective to use a dense, hard insulating film such as a tantalum oxide film.

Although the first wiring line is a wiring line of the same pattern as shown in FIG. 1B, it is sectioned into 102a, 102b, and 102c for the sake of explanation. Here, the first wiring line 102a represents an intersection with the active layer, the first wiring line 102b represents a connection between the TFTs, and the first wiring line 102c represents a power supplying portion common to the circuits.

The first wiring line 102a here functions as a subordinate gate electrode of the NTFT. That is, the electric charge of the channel formation region 112 is controlled by the first wiring line 102a and by the second wiring line (main gate electrode) 107a that is given with the same level of electric potential as the first wiring line 102a (or a predetermined electric potential), so that only the first wiring line 102a can apply a gate voltage (or a predetermined voltage) to the LDD regions 113.

Accordingly, the GOLD structure cannot be obtained with the second wiring line 107a alone functioning as the gate electrode (the LDD structure is obtained instead), not until the first wiring line 102a joins with the second wiring line 113a. Advantages of this structure will be described later. The first wiring line 102a also functions as a light-shielding layer.

Any material can be used for the first wiring line as long as it has conductivity. However, a desirable material would be one having heat resistance against the temperature in a later process. For example, a conductive film mainly containing (50% or more composition ratio) an element selected from the group consisting of tantalum (Ta), chromium (Cr), titanium (Ti), tungsten (W), molybdenum (Mo), and silicon (Si), or an alloy film or silicide film containing the above elements in combination.

Specifically, a tantalum film, a chromium film, or a laminate of a tungsten silicide film and a silicon film is preferred. When a laminate of a tungsten silicide film and a silicon film is used, it is preferable to place the laminate such that the silicon film is closer to the active layer.

Given as a feature of this embodiment mode is providing the first wiring line 102a in the NTFT only and not in the PTFT. Although the PTFT in FIG. 1A does not have an offset region and an LDD region either, one of the regions or both of the regions may be formed in the PTFT.

Structured as above, the first wiring line is led from the power supplying portion through the connection to the NTFT to function as a subordinate gate electrode of the NTFT as shown in FIG. 1B.

The second wiring line is also a wiring line of the same pattern but, for the sake of explanation, is sectioned almost the same way the first wiring line is sectioned. In FIG. 1A, 107a represents an intersection with the active layer of the NTFT 104, 107b represents an intersection with the active layer of the PTFT 105, 107c represents a connection between the TFTs, and 107d represents a power supplying portion.

Any film can be used for the second wiring lines as long as it is a conductive film. A tantalum (Ta) film, a chromium (Cr) film, a titanium (Ti) film, a tungsten (W) film, a molybdenum (Mo) film, and a silicon (Si) film may be used in any combination to form the second wiring lines. An alloy film or silicide film of those may also be used. Alternatively, same kind of conductive films or different kinds of conductive films may be layered to form the second wiring lines.

As described above, the CMOS circuit of this embodiment mode has the first wiring line (subordinate gate wiring line) in the NTFT and the same level of voltage as the second wiring line (main gate wiring line) or a predetermined voltage is applied to the first wiring line, thereby giving the NTFT the GOLD structure.

Embodiment Mode 2

An embodiment mode of the present invention will be described taking as an example a pixel matrix circuit that uses an NTFT for a pixel TFT. This pixel matrix circuit is formed on the same substrate as the CMOS circuit described in Embodiment Mode 1 at the same time. Therefore, see the description in Embodiment Mode 1 for details of the wiring lines of the identical names.

A sectional structure thereof is shown in FIG. 2A and a top view thereof is shown in FIG. 2B. The description will be given using symbols common to FIG. 2A and FIG. 2B. The sectional views taken along the lines A–A', B–B', and C–C' in FIG. 2B correspond to the sectional views A–A', B–B', and C–C' in FIG. 2A, respectively.

In FIG. 2A, 100 denotes a substrate; 201, a base film; 202a, 202b, and 202c, first wiring lines; 203, a first insulating layer; 204, an active layer of NTFT; 205, an active layer of PTFT; and 206, a second insulating layer. Note that, though the description here takes as an example the pixel TFT having a double gate structure, the pixel TFT may have a single gate structure or a mulch gate structure connected three or more TFTs in series.

Here, a storage capacitor is formed between the capacitor wiring line 203 and an active layer 205 (namely, a portion extended from the drain region) with the first insulating layer 204 as dielectric. In this case, the first insulating layer 204 is put on a silicon nitride film as a laminated structure with a silicon oxide film and an active layer is formed after removing a silicon oxide film to be the part of the storage capacitor selectively, and then it is realized that the storage capacitor has only a silicon nitride film with high dielectric constant as a dielectric.

Second wiring lines 207a, 207b and 207c are provided on the second insulating layer 206. A second wiring line 207a is a so-called gate wiring line and 207b and 207c are substantially gate electrodes.

Denoted by 208 is a first interlayer insulating layer, 209 and 210, third wiring lines, 209, a source wiring line (including a source electrode), and 215, a drain wiring line (including a drain electrode). Formed thereon are a second interlayer insulating layer 211, a black mask 212, a third interlayer insulating layer 213, and a pixel electrode 214.

Although the first wiring line is a wiring line of the same pattern as shown in FIG. 2B, it is sectioned into 202a, 202b, and 202c for the sake of explanation. Here, the first wiring line 202a represents a wiring line portion that does not function as a gate electrode, whereas 202b and 202c are intersections with the active layer 204 and function as the gate electrodes.

The first wiring lines shown here are formed at the same time the first wiring lines described in Embodiment Mode 1 are formed. Therefore the material and other explanations thereof are omitted.

The first wiring lines 202b and 202c function as light-shielding films of the pixel TFT. In other words, they do not have the function of the subordinate gate wiring line as the one described in Embodiment Mode 1, and are given a fixed electric potential or set to a floating state (an electrically isolated state). That is, the first wiring lines 202b and 202c in the pixel TFT have to have such an electric potential as to make them function merely as light-shielding layers without influencing the operation of the TFT.

The fixed electric potential is at least lower than the lowest electric potential of a video signal (specifically −8V, if the amplitude of the video signal is −8 to 8V), preferably lower than the lowest power supply electric potential of the entire circuit to be formed or the same as the lowest power supply electric potential.

In the case of an AM-LCD, for example, power supply lines formed in a driver circuit and other signal processing circuits are different from ones formed in a pixel matrix circuit, and these different power supply lines are given with their respective predetermined electric potentials. That is, various levels of voltages are generated with a certain lowest electric potential as the reference. The lowest power supply electric potential refers to the lowest electric potential that is the reference for all those circuits.

By keeping the first wiring lines at the electric potential described above, holes generated by hot carrier injection can be removed from the channel formation regions and the punch through phenomenon brought by accumulated holes can be prevented.

Electric charges in the channel formation regions 215 and 216 are thus controlled by the first wiring lines 207b and 207c to provide the LDD structure. Therefore an increase in OFF current can be contained effectively.

The pixel matrix circuit shown in this embodiment mode thus has an NTFT as its pixel TFT, and the structure of the NTFT is the same as the NTFT of the CMOS circuit explained in Embodiment Mode 1. However, the NTFT in the pixel matrix circuit is different from the NTFT in the CMOS circuit where the GOLD structure is obtained by using the first wiring line as a subordinate gate wiring line through application of a predetermined voltage, in that the LDD structure is obtained by giving the first wiring lines a fixed electric potential or setting them to a floating state.

In other words, the biggest feature of the present invention is that NTFTs having the same structure are formed on the same substrate and then they are respectively given the GOLD structure or the LDD structure by being applied or not being applied a voltage to their first wiring lines (subordinate gate wiring lines). This makes the optimal circuit design possible without increasing the number of manufacture steps.

The structures of the present invention in the above will be described in detail in the following embodiments.

Embodiment 1

In this embodiment, a method of manufacturing the CMOS circuit described in Embodiment Mode 1 will be described. The description will be given with reference to FIG. 3.

First, a glass substrate is prepared as a substrate 300. A silicon oxide film with a thickness of 200 nm is formed thereon by sputtering as a base film 301. On the base film, first wiring lines 302a, 302b, and 302c are formed. The material of the first wiring lines is a tantalum film formed by sputtering. An oxide film may be formed on a surface of the tantalum film.

Other metal films, alloy films, or a laminate of those may of course be used because the first wiring lines 302a, 302b, and 302c can be formed of any film as long as it has conductivity. A film that can be formed by patterning with a small taper angle is effective in improving the levelness.

A second insulating layer 303 is formed next from an insulating film containing silicon. The first insulating layer 303 functions as a gate insulating film in using the first wiring line 302a as a subordinate gate wiring line as well as performs as a base film to protect an active layer.

This embodiment employs a layered structure in which a silicon nitride film with a thickness of 50 nm is formed first and a silicon oxide film with a thickness of 80 nm is formed thereon. It may of course be a silicon oxynitride film expressed as SiOxNy (x/y=0.01 to 100). In this case, the withstand voltage thereof can be enhanced by making the nitrogen content larger than the oxygen content.

Next, an amorphous silicon film (not shown in the drawing) with a thickness of 50 nm is formed and a crystalline silicon film is formed by crystallizing using a known laser crystallization technique. And the crystalline silicon film is patterned to form active layers 304 and 305. In process of crystallization in this embodiment, an amorphous silicon film is irradiated by processing the pulse-oscillating typed excimer laser light into a linear beam.

Although this embodiment uses as a semiconductor film for the active layers a crystalline silicon film obtained by crystallizing an amorphous silicon film, other semiconductor films such as a microcrystalline silicon film may be used or a crystalline silicon film may be formed directly. Other than silicon films, a compound semiconductor film such as a silicon germanium film may be used.

The crystalline silicon film may be doped with an element belonging to Group 13 and/or an element belonging to Group 15 before or after the active layers 305 and 306 are formed. The element or elements used for the doping here is/are for controlling threshold voltage of the TFTs.

For example, the entire crystalline silicon film is doped first with boron as the element belonging to Group 13 to control the threshold in the plus direction, and then selectively doped with phosphorus to control the threshold in the minus direction, whereby threshold voltages of the NTFT and the PTFT are adjusted to desired values.

A second insulating layer 306 is formed next from a silicon oxide film, a silicon oxynitride film, or a silicon nitride film, or a laminate of those so as to cover the active layers 304 and 305. A silicon oxynitride film is formed here by plasma CVD to a thickness of 100 nm. The second insulating layer functions as a gate insulating film when a second wiring line is used as a main gate wiring line.

A tantalum film 307 to serve later as the second wiring line is formed to have a thickness of 200 nm. Either sputtering or CVD can be used to form the tantalum film 207.

After the state of FIG. 3A is thus obtained, resist masks 308a and 308b are formed to etch the tantalum film 307. In this way, a second wiring line 309a is formed from the tantalum film. The second wiring line 309a corresponds to the second wiring line (main gate wiring line) 107a in FIG. 1A. A tantalum film 309b is left so as to hide regions other than the region to become the NTFT.

Next, the film is doped with an element belonging to Group 15 (typically, phosphorus or arsenic) to form low concentration impurity regions 310 and 311. In this embodiment, phosphorus is used as the element belonging to Group 15, and ion doping that does not involve mass separation is employed. Doping conditions include setting the acceleration voltage to 90 keV, and adjusting the dose so that phosphorus is contained in a concentration of $1\times10^{16}$ to $1\times10^{19}$ atoms/cm$^3$ (preferably $5\times10^{17}$ to $5\times10^{18}$ atoms/cm$^3$). This concentration later sets the impurity concentration in the LDD regions, and hence is needed to be controlled precisely. (FIG. 3B)

In this specification, the impurity doping step conducted under those conditions is called a phosphorus (n−) doping step.

The resist masks 308a and 308b are then removed and resist masks 312a to 312d are newly formed. The tantalum film 309b is etched to form second wiring lines 313a to 313c. The second wiring lines 313a, 313b, and 313c respectively correspond to the second wiring lines 107b, 107c, and 107d of FIG. 1A.

Next, the film is doped with an element belonging to Group 13 (typically boron or gallium) to form impurity regions 314 and 315. A channel formation region 316 of the PTFT is defined simultaneously. In this embodiment, boron is used as the element belonging to Group 13, and ion doping that does not involve mass separation is employed. Doping conditions include setting the acceleration voltage to 75 keV, and adjusting the dose so that boron is contained in a concentration of $1\times10^{19}$ to $5\times10^{21}$ atoms/cm$^3$ (preferably $1-10^{20}$ to $1\times10^{21}$ atoms/cm$^3$). (FIG. 3C)

In this specification, the impurity doping step conducted under those conditions is called a boron (p++) doping step.

The resist masks 312a to 312d are then removed and resist masks 317a to 317d are formed again. In this embodiment, the resist masks are formed by a back side exposure method. For the resist masks 317a, 317c, and 317d, the first wiring lines serve as masks whereas the second wiring lines serve as masks for the resist mask 317b. With the first wiring lines as masks, a small amount of light reaches behind the wiring lines and hence the line width in this case is narrower than the width of the first wiring lines. The line width can be controlled by exposure conditions. That is, the width (length) of the LDD regions can be controlled by controlling the amount of light that reaches behind the wiring lines.

The resist masks can of course be formed by using masks instead. In this case, the degree of freedom in pattern design is raised but the number of masks is increased.

After the resist masks 317a to 317d are thus formed, a step of doping with an element belonging to Group 15 (phosphorus in this embodiment) is conducted. Here, the acceleration voltage is set to 90 keV, and the dose is adjusted so that phosphorus is contained in a concentration of $1\times10^{19}$ to $5\times10^{21}$ atoms/cm$^3$ (preferably $1\times10^{20}$ to $1\times10^{21}$ atoms/cm$^3$).

In this specification, the impurity doping step conducted under those conditions is called a phosphorus (n+) doping step.

Through this step, a source region 318, a drain region 319, an LDD region 320, and a channel formation region 321 of the NTFT are defined. A drain region 322 and a source region 323 of the PTFT are also doped with phosphorus in this step. However, the P type conductivity thereof can be maintained and is not reversed to the N type conductivity if they are doped with boron in a higher concentration in the previous step.

After the NTFT and the PTFT are thus doped with impurity elements each imparting one of the conductivity types, the impurity elements are activated by furnace annealing, laser annealing, or lamp annealing, or by using these annealing methods in combination.

The state of FIG. 3D is obtained in this way. Then a first interlayer insulating layer 324 is formed from a silicon oxide film, a silicon nitride film, a silicon oxynitride film, or a resin film, or from a laminate of those films. Contact holes are opened in the layer to form source wiring lines 325 and 326 and a drain wiring line 327. (FIG. 3E).

The first interlayer insulating layer 324 in this embodiment has a two-layer structure in which a silicon nitride film with a thickness of 50 nm is formed first and a silicon oxide film with a thickness of 950 nm is formed thereon. Source wiring lines and drain wiring lines in this embodiment are formed by patterning a three-layer structure laminate obtained by successively forming, by sputtering, a titanium film with a thickness of 100 nm, an aluminum film containing titanium and having a thickness of 300 nm, and another titanium film with a thickness of 150 nm.

A CMOS circuit structured as shown in FIG. 3E is thus completed. The CMOS circuit of this embodiment has the structure shown in FIG. 1A, and explanations thereof are omitted here because it is described in detail in Embodiment Mode 1. To obtain the structure of FIG. 1A, the manufacturing process is not necessarily limited to the process of this embodiment. For example, the NTFT may take the double gate structure while the PTFT is given the single gate structure.

The CMOS circuit described in this embodiment serves as a basic unit circuit for constructing a driver (driving) circuit (including a shift register circuit, a buffer circuit, a level shifter circuit, a sampling circuit, etc.) and other signal processing circuits (such as a divider circuit, a D/A converter circuit, a γ correction circuit, and an operation amplifier circuit) in an AM-LCD.

In this embodiment, the first wiring line of the NTFT is used as a subordinate gate wiring line to thereby obtain a substantial GOLD structure and prevent degradation by hot carrier injection. Accordingly, a circuit having a very high reliability can be formed.

Embodiment 2

In this embodiment, a method of manufacturing the pixel matrix circuit described in Embodiment Mode 2 will be described. The description will be given with reference to FIGS. 4 and 5. The pixel matrix circuit is formed on the same substrate as the CMOS circuit shown in Embodiment 1 at the same time. Therefore, the description will be given in relation to the manufacturing process of Embodiment 1 and the symbols identical with those in FIG. 3 are used when necessary.

First, the base film 301 is formed on the glass substrate 300 from a tantalum oxide film. On the base film, first wiring lines 401a, 401b, and 401c and a capacitor wiring line 402 are formed. The first wiring line 401a corresponds to the first wiring line 202a in FIG. 2A, the first wiring line 401b corresponds to the first wiring line 202b in FIG. 2A, and the first wiring line 401c corresponds to the first wiring line 202c in FIG. 2A.

The capacitor wiring line 402 corresponds to the capacitor wiring line 203 in FIG. 2A. The materials of the second wiring lines and the capacitor wiring line are as described in Embodiment 1.

Next, a first insulating layer 303, an active layer of a pixel TFT 403, a second insulating layer 306 and a tantalum film are formed consulting Embodiment 1. Thus obtained is the state of FIG. 4A. The CMOS circuit being formed simultaneously is now in the state of FIG. 3A.

Next, resist masks 404a to 404c are formed to etch the tantalum film 307. Second wiring lines 405a and 405c are thus formed. The second wiring line 405a corresponds to the second wiring line 207a in FIG. 2A, the second wiring line 405b corresponds to the second wiring line 207b in FIG. 2A, and the second wiring line 405c corresponds to the second wiring line 207c in FIG. 2A.

The phosphorus (n–) doping step for forming LDD regions later is conducted next to form low concentration impurity regions 406 to 408. This step corresponds to the step of FIG. 3B. Accordingly, the material and the thickness of the second wiring lines and phosphorus doping conditions in the step of FIG. 4B are the same as Embodiment 1.

A step corresponding to the step of FIG. 3C is conducted next. In this step, the entire surface of the pixel matrix circuit is covered with a resist mask 409 so as to avoid boron doping at all. (FIG. 4C)

The resist mask 409 is then removed. After that, resist masks 410a to 410d are formed by the back side exposure method. Then the phosphorus (n+) doping step is conducted to form a source region 411, a drain region 412, LDD regions 413 and 414, and channel formation regions 415 and 416. The back side exposure conditions and the phosphorus doping conditions are set in accordance with the step of FIG. 3D in Embodiment 1.

The source region and the drain region in FIG. 4D are named so for the sake of explanation. However, a source region and a drain region in a pixel TFT are reversed when the pixel switches between charging and discharging and hence there is no definite discrimination between the two regions.

A region denoted by 417 is hidden by the resist mask 410d and, as a result, the region is doped with phosphorus in the same concentration as the LDD regions 413 and 414. This region can function as an electrode by applying a voltage to the first wiring lines 402. The first wiring lines 402, the first insulating layer 303, and the low concentration impurity region 417 form the storage capacitor.

After the doping steps of phosphorus and boron are finished, the impurity elements are activated as in Embodiment 1. Then the first interlayer insulating film 324 is formed and contact holes are opened therein to form a source wiring line 418 and a drain wiring line 419. The state of FIG. 4E is thus obtained. The CMOS circuit at this point is in the state of FIG. 3E.

Next, a second interlayer insulating layer 420 is formed to cover the source wiring line 418 and the drain wiring line 419. In this embodiment, as a passivation film, a silicon nitride film with a thickness of 30 nm is formed and an acrylic film with a thickness of 700 nm is formed thereon. Of course, an insulating film mainly containing silicon such as a silicon oxide film, or other resin films may be used. Other resin films that are usable are a polyimide film, a polyamide film, a BCB (benzocyclobutene) film, and the like.

Next, a black mask 421 is formed from a titanium film having a thickness of 100 nm. Other films may be used to form the black mask 421 if they have light-shielding property. Typically, a chromium film, an aluminum film, a tantalum film, a tungsten film, a molybdenum film, a titanium film, or a laminate of these films is used.

A third interlayer insulating layer 422 is then formed. Though an acrylic film with a thickness of 1 μm is used in this embodiment, the same material as the second interlayer insulating layer may be used instead.

A contact hole is next formed in the third interlayer insulating layer 422 to form a pixel electrode 423 from a transparent conductive film (typically an ITO film). The pixel electrode 423 is electrically connected to the drain wiring line 419. The contact hole accordingly has to be very deep, and hence it is effective in preventing failure such as break of the pixel electrode to form the contact hole such that its inner wall is tapered or curved.

A pixel matrix circuit structured as shown in FIG. 5A is thus completed. Although the example shown in this embodiment is of manufacturing a transmissive AM-LCD using a transparent conductive film for a pixel electrode, a reflective AM-LCD can readily be manufactured if a metal film having high reflectance (such as a metal film mainly containing aluminum) is used for the pixel electrode.

The substrate that has reached the state of FIG. 5A is called an active matrix substrate. This embodiment also describes a case of actually manufacturing an AM-LCD.

After the state of FIG. 5A is obtained, an oriented film 424 with a thickness of 80 nm is formed. An opposite substrate is fabricated next. The opposite substrate prepared is composed of a glass substrate 425 on which a color filter 426, a transparent electrode (opposite electrode) 427, and an oriented film 428 are formed. The oriented films 424 and 428 are subjected to rubbing treatment, and the active matrix substrate is bonded to the opposite substrate using a seal (sealing member). Then a liquid crystal 429 is held between the substrates.

A spacer for maintaining the cell gap may be provided if necessary. When the cell gap can be maintained without a spacer as in an AM-LCD having a diagonal size of 1 inch or less, there is no particular need to place a spacer.

An AM-LCD structured as shown in FIG. 5B (the part corresponding to a pixel matrix circuit) is thus completed. The second interlayer insulating layer 420 and the third interlayer insulating layer 422 of this embodiment also cover the CMOS circuit shown in Embodiment 1 in actuality. Wiring lines may be formed at the same time the black mask 421 and the pixel electrode 423 are formed from the same materials that constitute the black masks and the pixel electrode, so that the wiring lines are used as lead out wiring lines (fourth wiring lines or fifth wiring lines) of a driver circuit and a signal processing circuit of the AM-LCD.

In this embodiment, the first wiring lines 401*b* and 401*c* provided in the pixel TFT are set to the lowest power supply electric potential. This makes it possible to draw holes generated in the drain end due to hot carrier injection to the first wiring lines, thereby improving the reliability. The first wiring lines 401*b* and 401*c* may of course be set to a floating state, but the hole drawing effect cannot be expected in this case.

Embodiment 3

In this embodiment, an AM-LCD is provided with a pixel matrix circuit and a CMOS circuit (a driver circuit and a signal processing circuit constructed of CMOS circuits, to be exact) according to the present invention, and the appearance thereof is shown in FIG. 6.

On an active matrix substrate 601, a pixel matrix circuit 602, a signal line driving circuit (source driver circuit) 603, scanning line driving circuits (gate driver circuits) 604, and a signal processing circuit (including a signal divider circuit, a D/A converter circuit, and a γ correction circuit) 605 are formed. An FPC (flexible printed circuit) 606 is attached to the active matrix substrate. Denoted by 607 is an opposite substrate.

The various circuits formed on the active matrix substrate 601 are illustrated in detail in a block diagram of FIG. 7.

In FIG. 7, 701 denotes a pixel matrix circuit that functions as an image display unit. 702*a*, 702*b*, and 702*c* represent a shift register circuit, a level shifter circuit, and a buffer circuit, respectively. The three together constitute a gate driver circuit.

The block diagram of the AM-LCD in FIG. 7 has a pixel matrix circuit sandwiched between gate driver circuits, which share the same gate wiring lines. This means that application of voltage to the gate wiring lines is still possible even after one of the gate drivers fails, thereby giving the AM-LCD redundancy.

703*a*, 703*b*, 703*c*, and 703*d* represent a shift register circuit, a level shifter circuit, a buffer circuit, and a sampling circuit, respectively. The four together constitute a source driver circuit. A precharge circuit 14 is placed across the pixel matrix circuit from the source driver circuit.

The reliability of an AM-LCD having circuits as those shown in FIG. 6 can be greatly improved by employing the present invention. In this case, CMOS circuits constituting a driver circuit and a signal processing circuit are made in accordance with Embodiment 1 and a pixel matrix circuit is made in accordance with Embodiment 2.

Embodiment 4

This embodiment gives a description on a case where a CMOS circuit is structured differently from Embodiment 1 and a pixel matrix circuit is structured differently from Embodiment 2. To be specific, circuits are given different structures in accordance with the respective specifications the circuits demand.

The basic structure of the CMOS circuit is identical with the structure shown in FIG. 1A and the basic structure of the pixel matrix circuit is identical with the structure shown in FIG. 2A. Therefore only the part that needs explanation is denoted by a symbol and explained in this embodiment.

The structure shown in FIG. 8A lacks an LDD region on the source side of the NTFT and has an LDD region 801 only on the drain side. The CMOS circuit, which is used in a driver circuit and a signal processing circuit, is required to operate at high speed and hence resist components that can cause reduction in operation speed have to be removed as much as possible.

In the case of the CMOS circuit according to the present invention, a gate voltage is applied to a first wiring line functioning as a subordinate gate wiring line to obtain the GOLD structure and prevent degradation due to hot carrier injection. However, it is sufficient if an LDD region that overlaps a gate electrode is formed at an end of a channel formation region on the drain region side where hot carriers are injected.

Accordingly, an LDD region at an end of the channel formation region on the source region side is not indispensable. On the contrary, the LDD region on the source region side might work as a resist component. The structure shown in FIG. 8A is therefore effective in improving the operation speed.

The structure of FIG. 8A cannot be applied to a circuit that behaves like a pixel TFT in which a source region and a drain region are switched. Since a source region and a drain region of a CMOS circuit are normally fixed, the CMOS circuit can adopt the structure of FIG. 8A.

FIG. 8B is basically identical with FIG. 8A but the width of an LDD region 802 in FIG. 8B is narrower than in FIG. 8A. Specifically, the width is set to 0.05 to 0.5 μm (preferably 0.1 to 0.3 μm). The structure in FIG. 8B is capable of not only reducing the resist component on the source region side but also reducing the resist component on the drain region side as much as possible.

This structure is actually suitable for a circuit that is driven at as low voltage as 3 to 5 V and is required to operate at high speed, such as a shift register circuit. Because of the low operation voltage, the narrow LDD region (LDD region that overlaps a gate electrode, strictly speaking) does not raise the problem related to hot carrier injection.

Of course, LDD regions in the NTFT may be completely omitted in some cases if the omission is limited to the shift register circuit. In this case, the NTFT of the shift register circuit has no LDD region while other circuits in the same driver circuit employ the structure shown in FIG. 1A or the structure shown in FIG. 8B.

Next, FIG. 8C shows an example of a CMOS circuit with its NTFT having the double gate structure and PTFT having the single gate structure. In this case, LDD regions 805 and 806 are provided only at ends of channel formation regions 803 and 804 which are closer to drain regions.

The width of an LDD region is determined by the amount of light that reaches around in the back side exposure step as shown in FIG. 3D. However, if resist masks are formed by mask alignment, the masks can be designed freely. Forming an LDD region only on one side is easy also in the structure shown in FIG. 8C if a mask is used.

However, forming an LDD region only on one side by the back side exposure method is possible when gate wiring lines (second wiring lines) 807a and 807b are formed so as not to coincide with first wiring lines 808 and 809 as in this embodiment.

This structure can eliminate the resist component by an LDD region on the source side and the double gate structure has an effect of diffusing and easing the electric field applied between the source and the drain.

The structure in FIG. 8D is a mode of a pixel matrix circuit. In the structure of FIG. 8D, LDD regions 809 and 810 are provided on either the side closer to the source region or the side closer to the drain region. In other words, no LDD region is provided between two channel formation regions 811 and 812.

In the case of a pixel TFT, a source region and a drain region are frequently switched because charging and discharging are repeated. Accordingly, when the pixel TFT has a structure of FIG. 8D, the LDD region can always be in the channel formation region on the drain region side whichever region serves as the drain region. On the other hand, it is effective in increasing ON current (current flowing when the TFT is in an ON state) to omit an LDD region that can be a resist component between the channel formation regions 811 and 812 because there is no electric field concentration between the channel formation regions.

An LDD region is not provided at an end of the channel formation region on the source region side in the structures of FIGS. 8A to 8D. However, the LDD region may be provided there if it has a narrow width. This structure may be obtained by forming resist masks through mask alignment or by the back side exposure method after the position of the first wiring lines and the second wiring lines is adjusted.

Needless to say, the structure of this embodiment can be combined with Embodiments 1 and 2 and applied to the AM-LCD shown in Embodiment 3.

Embodiment 5

This embodiment shows with reference to FIG. 9 a case of forming a storage capacitor with a differenet structure from a pixel matrix circuit shown in Embodiment 2. Since the fundamental structure is in the same way as FIG. 2A, only necessary parts are denoted by the symbols in this embodiment.

The structure shown in FIG. 9A uses an active layer (strictly speaking, the portion extended from a drain region 904), a second insulating layer 902 and a capacitor wiring line 903, which a storage capacitor is formed in the same layer as the second wiring line. In this case, a region 904 which functions as an electrode of a storage capacitor is not doped impurity elements to give conductivity because a capacitor wiring line 903 performs a mask, and the state must be kept,which an inverse layer is formed in the active layer by adding a voltage to the capacitor wiring line 903 at all times.

The structure of FIG. 9B is an example of combining the structure of the storage capacitor shown in. FIG. 2A with the structure of the storage capacitor shown in FIG. 9A. Concretely, a first storage capacitor is formed by a first capacitor wiring line 905, which is in the same layer as the first wiring line, a first insulating layer 906 and an active layer 907, and a second storage capacitor is formed by an active layer 907 (exactly, a region shown as 908), a second insulating layer 909 and a second capacitor wiring line 910, which is in the same layer as the first wiring line.

This structure can ensure a nearly double capacitor of the structure of the storage capacitor shown in FIG. 2A and FIG.9A without increasing the number of process. Specially, the minuter AM-LCD requires the smaller size of the storage capacitor in order to improve the aperture ratio. In such a case, the structure of FIG. 9B is effective.

It is effective to use the structure of this embodiment in AM-LCD shown in Embodiment 3.

Embodiment 6

This embodiment shows with reference to FIG. 10 a case in which a part of the second wiring lines in the CMOS circuit shown in FIG. 1A and in the pixel matrix circuit shown in FIG. 2A is changed in structure. In FIG. 10A, parts structured in the same way as FIG. 1A or FIG. 2A are denoted by the same symbols.

A CMOS circuit in FIG. 10A uses a laminate 1001 consisting of a first conductive layer 1001a and a second conductive layer 1001b for only a part of a second wiring line that corresponds to a power supplying portion. In this specification, a wiring line structure denoted by 1001 is called a cladding structure.

In the cladding structure, the material of the first conductive layer 1001a may be a conductive film mainly containing an element selected from the group consisting of tantalum, titanium, chromium, tungsten, molybdenum, and silicon, or an alloy film or silicide film containing the above elements in combination. The material of the second conductive layer 1001b is desirably a metal film mainly containing (50% or more composition ratio) copper or aluminum.

With this structure, the power supplying portion (the portion denoted by 107d in FIG. 1B) of the second wiring line has the first conductive layer 101a clad by the second conductive layer 1001b. Undesirably, this structure might allow aluminum or copper that is an element constituting the first conductive layer 1001a to diffuse into a second insulating layer (an insulating layer that is the base of the second wiring line). Therefore a silicon nitride film is formed on the surface of the second insulating layer to prevent diffusion of aluminum or copper effectively.

The structure of this embodiment may also be applied to a pixel matrix circuit. The pixel matrix circuit in FIG. 10B uses a single layer of tantalum film for a second wiring line (a gate wiring line) and a capacitor wiring line and employs the above-mentioned cladding structure for a part of the gate wiring line that is required to reduce wiring line resistance (a part equal to 207a in FIG. 2B).

Needless to say, the circuits shown in FIG. 10A and FIG. 10B are both formed on the same substrate at the same time.

It can also be applied to the AM-LCD of Embodiment 3 and can be combined with the structure shown in Embodiment 4 and 5.

Embodiment 7

This embodiment shows with reference to FIG. 11 a case in which the LDD regions of the NTFTs in the CMOS circuit of FIG. 1A and in the pixel matrix circuit of FIG. 2A are arranged differently. In FIG. 11A, parts structured in the same way as FIG. 1A or FIG. 2A are denoted by the same symbols.

In the CMOS circuit shown in FIG. 11A, the NTFT has a portion where a gate electrode 1101 overlaps a LDD region 1102 and a portion where the gate electrode does not overlap the LDD regions. In this structure, the length of the portion where the gate electrode 1101 overlaps the LDD region 1102 is set to 0.1 to 3.5 µm (typically 0.1 to 0.5 µm, preferably 0.1 to 0.3 µm) whereas the length of the portion where the gate electrode 1101 does not overlap the LDD region 1102 is set to 0.5 to 3.5 µm (typically 1.5 to 2.5 µm).

In this structure, the portion where the gate electrode 1101 overlaps the LDD region 1102 exhibits substantially the same effect as the GOLD structure whereas the portion where the gate electrode does not overlap the LDD regions exhibits substantially the same effect as the LDD structure. How much the gate electrode overlaps may be determined by mask alignment or by controlling the amount of light that reaches around.

A feature of this structure is that the LDD regions overlapping the gate electrode prevent degradation of ON current and an LDD region which is provided outside thereof and to which a gate voltage is not applied prevents an increase in OFF current. Accordingly, the structure of FIG. 11A is effective when reduction in OFF current is also required in a CMOS circuit.

Similarly, in the pixel matrix circuit shown in FIG. 11B, the pixel TFT has portions where gate electrodes 1103 and 1104 overlap LDD regions 1105 and 1106 and portions where the gate electrodes 1103 and 1104 do not overlap the LDD regions 1105 and 1106. In this case, the first wiring lines 202b and 202c do not function as subordinate gate wiring lines and hence electric charges in channel formation regions are controlled by the gate electrodes 1103 and 1104 alone.

With the structure of the pixel TFT described in Embodiment Mode 2, the pixel TFT operates as a complete LDD structure. However, the structure of FIG. 11B can provide a pixel TFT that is strong against hot carrier injection (a pixel TFT in which ON current is not degraded or is degraded less).

The structure of this embodiment can also be applied to the AM-LCD of Embodiment 3 and can be combined freely with the structures shown in Embodiments 4 to 6.

Embodiment 8

This embodiment gives a description with reference to FIG. 12 on a structure for reducing OFF current of an NTFT in a CMOS circuit to be used in a driver circuit.

In FIG. 12, LDD regions 1201 and 1202 of the NTFT can be divided into portions that substantially overlap a first wiring line 102a and portions that do not overlap the first wiring line 102a. The NTFT in FIG. 12 therefore has an LDD region that does not overlap a gate electrode outside an LDD region that overlaps the gate electrode when a gate voltage is applied to the first wiring line 102a.

As described in Embodiment 7, this structure has the effect of preventing degradation of ON current which is an advantage of the GOLD structure and, in addition, can provide an electric characteristic of limited increase in OFF current which cannot be attained by the GOLD structure. Therefore a CMOS circuit with very excellent reliability can be obtained.

The description here takes as an example a CMOS circuit but the structure of this embodiment may be applied to a pixel matrix circuit.

In order to obtain the structure of this embodiment, the back side exposure method is not used in the step shown in FIG. 3D in Embodiment 1. The structure of this embodiment is readily obtained when a resist mask wider than the first wiring line is formed by a normal mask alignment and then the phosphorus (n+) doping step is conducted.

The length of the LDD regions (the length of the portions that overlap and do not overlap the gate electrode) is set consulting the range mentioned in Embodiment 7.

The structure of this embodiment can also be applied to the AM-LCD of Embodiment 3 and can be combined freely with the structures shown in Embodiments 4 through 7.

Embodiment 9

This embodiment describes a case in which other methods than thermal crystallization is used to form the active layer shown in Embodiment 1 or 2

Specifically, a case is described in which the crystalline semiconductor film to use as an active layer is formed by the thermal crystallization method using the catalytic element. In the case used the catalytic element, it is desirable to use the technique disclosed in Japanese Patent Application Laid-open No. Hei 7-130652 (corresponding to U.S. patent application Ser. No. 08/329,644 or U.S. patent application Ser. No. 08/430,623) and Japanese Patent Application Laid-open No. Hei 8-78329. Specially, it is preferable to use nickel as the catalytic element.

The structure of this embodiment can be combined freely with all of the structures of Embodiments 1 through 8.

Embodiment 10

This embodiment describes a case, as a method of forming an active layer, in which the thermal crystallization method shown in Embodiment 9 is used and the catalytic element used in crystallization is removed from the crystalline semiconductor film. To remove the catalytic element, this embodiment employs a technique disclosed in Japanese Patent Application Laid-open No. Hei 10-135468 (corresponding to U.S. patent application Ser. No. 08/951, 193) or Japanese Patent Application Laid-open No. Hei 10-135469 (corresponding to U.S. patent application Ser. No. 08/951,819).

The technique described in the publication is to remove a catalytic element used in crystallization of an amorphous semiconductor film by utilizing gettering effect of halogen after crystallization. With this technique, the concentration of the catalytic element in the crystalline semiconductor film can be reduced to $1 \times 10^{17}$ atoms/cm$^3$ or less, preferably to $1 \times 10^{16}$ atoms/cm$^3$.

The structure of this embodiment can be combined freely with all of the structures of Embodiments 1 through 9.

Embodiment 11

This embodiment describes a case, as a method of forming an active layer, in which the thermal crystallization method shown in Embodiment 9 is used and the catalytic element used in crystallization is removed from the crystalline semiconductor film. To remove the catalytic element, this embodiment employs a technique disclosed in Japanese Patent Application Laid-open No. Hei 10-270363 (corresponding to U.S. patent application Ser. No. 09/050, 182).

The technique described in the publication is to remove a catalytic element used in crystallization by utilizing the gettering effect of phosphorus after crystallization. With this technique, the concentration of the catalytic element in the crystalline semiconductor film can be reduced to $1\times10^{17}$ atoms/cm$^3$ or less, preferably to $1\times10^{16}$ atoms/cm$^3$.

The structure of this embodiment can be combined freely with all of the structures of Embodiments 1 through 10.

Embodiment 12

This embodiment describes another mode of the gettering step by phosphorus which is shown in Embodiment 11. The basis of the step matches FIG. 1 and hence differences are picked out and explained.

First, the state of FIG. 3D is obtained by following the process of Embodiment 1. FIG. 13A shows a state in which the resist masks 317a to 317d are removed from the state of FIG. 3D. A semiconductor layer to be an active layer of TFT s formed by using a technique of the thermal crystallization shown in Embodiment 9.

At this point, the source region 318 of the NTFT and the drain region 319 thereof, and the drain region 322 of the PTFT and the source region 323 thereof contain phosphorus in a concentration of $1\times10^{19}$ to $1\times10^{21}$ atoms/cm$^3$ (preferably $5\times10^{20}$ atoms/cm$^3$).

In this state, a heat treatment step is conducted in a nitrogen atmosphere at 500 to 800° C. for 1 to 24 hours, for example, at 600° C. for 12 hours, in this embodiment. Through the step, the impurity elements belonged to Group 13 or 15 and used in doping are activated. Also, the catalytic element (nickel in this embodiment) remained after the crystallization step moves in the direction of the arrow and is gettered (trapped) in the source regions and drain regions mentioned above owing to the action of phosphorus contained in the regions. As a result, the nickel concentration in the channel formation region can be reduced to $1\times10^{17}$ atoms/cm$^3$ or less. (FIG. 13B)

Once the step of FIG. 13B is completed, subsequent steps are conducted in accordance with the steps of Embodiment 1 to complete the CMOS circuit shown in FIG. 3E. Needless to say, similar steps are taken in the pixel matrix circuit.

The structure of this embodiment can be combined freely with all of the structures of Embodiments 1 through 11.

Embodiment 13

This embodiment gives a description with reference to FIG. 14 in a case of manufacturing a CMOS circuit in a step order different from the one in Embodiment 1. Other Group 15 elements than phosphorus may be used instead. Other Group 13 elements than boron may be used instead.

First, steps up through the step of FIG. 3B are finished in accordance with the process in Embodiment 1. FIG. 14A shows a state identical with FIG. 3B and the same symbols are used. This is a phosphorus (n−) doping step through which the low concentration impurity regions 310 and 311 are formed.

After the resist masks 308a and 308b are removed, the back side exposure method is used to form resist masks 11a and 11b. The phosphorus (n+) doping step is then conducted under the same doping conditions as Embodiment 1 to form a source region 12, a drain region 13, a LDD region 14 and a channel formation region 15 of the NTFT. (FIG. 14B)

The resist masks 11a and 11b are removed next. Thereafter resist masks 16a to 16d are formed and the tantalum film 309b is etched to form second wiring lines 17a to 17c. In this state, the boron (p++) doping step is conducted under the doping conditions of Embodiment 1 to form a drain region 18, a source region 19, and a channel formation region 20 of the PTFT. (FIG. 14C)

In this embodiment, an active layer of the PTFT is not doped with phosphorus before it is doped with boron, whereby the dose of boron can be limited to a minimum. The throughput in the manufacturing process is therefore improved.

After the step of FIG. 14C is thus completed, fabrication of the CMOS circuit is continued in accordance with the process of Embodiment 1. The structure to be obtained is the one shown in FIG. 3E but is different from Embodiment 1 in that the source region and the drain region of the PTFT do not contain phosphorus.

The manufacturing process of this embodiment only changes the order of the doping process of the elements belonging to Group 13 or Group 15 in Embodiment 1. Therefore, as for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 11.

Embodiment 14

This embodiment gives a description with reference to FIG. 15 in a case of manufacturing a CMOS circuit in a step order different from the one in Embodiment 1. Other Group 15 elements than phosphorus may be used instead. Other Group 13 elements than boron may be used instead.

First, steps up through the step of FIG. 3A are finished in accordance with the process in Embodiment 1. Thereafter resist masks 21a to 21d are formed and the tantalum film 307 is etched to form a tantalum film 22a and second wiring lines 22b to 22d. In this state, the boron (p++) doping step is conducted under the doping conditions of Embodiment 1 to form a drain region 23, a source region 24, and a channel formation region 25 of the PTFT. (FIG. 15A)

The resist masks 21a to 21d are removed next. Thereafter resist masks 26a and 26b are formed and the tantalum film 22a is etched to form a second wiring line 27. In this state, the phosphorus (n−) doping step is conducted under the doping conditions of Embodiment 1 to form low concentration impurity regions 28 and 29. (FIG. 15B)

After the resist masks 26a and 26b are removed, the back side exposure method is used to form resist masks 30a to 30d. The phosphorus (n+) doping step is then conducted under the same doping conditions as Embodiment 1 to form a source region 31, a drain region 32, a LDD region 33 and a channel formation region 34 of the NTFT. (FIG. 15C)

In this embodiment, phosphorus is also doped into active layers of PTFT by step of FIG. 15C, and the drain region 35 and the source region 36 contain the same concentration of phosphorus as the source region 31 and the drain region 32 of NTFT. The circuit has a structure which is shown in FIG. 3E.

After the step of FIG. 15C is thus completed, fabrication of the CMOS circuit is continued in accordance with the process of Embodiment 1.

The manufacturing process of this embodiment only changes the order of the doping process of the elements belonging to Group 13 or Group 15 in Embodiment 1. Therefore, as for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 12.

Embodiment 15

This embodiment gives a description with reference to FIG. 16 in a case of manufacturing a CMOS circuit in a step order different from the one in Embodiment 1. Other Group 15 elements than phosphorus may be used instead. Other Group 13 elements than boron may be used instead.

First, steps up through the step of FIG. 15A are finished in accordance with the process in Embodiment 14 (also referred to Embodiment 1). FIG. 16A shows a state identical with FIG. 15A and the same symbols are used. This is a boron (p++) doping step through which a drain region 23, a source region 24 and a channel formation region 25 of PTFT are formed.

The resist masks 21a to 21d are removed next. Thereafter resist masks 38a and 38b are formed and the tantalum film 22a is etched to form a second wiring line 39. In this state, the phosphorus (n−) doping step is conducted under the doping conditions of Embodiment 1 to form low concentration impurity regions 40 and 41. (FIG. 16B)

The resist masks 38a and 38b are removed next. Thereafter resist masks 42a and 42b are formed and the second wiring line 39 is etched to form a second wiring line 43. In this state, the phosphorus (n−) doping step is conducted under the doping conditions of Embodiment 1 to form a source region 44, a drain region 45, a LDD region 46 and a channel formation region 47 of the NTFT. (FIG. 16C)

This embodiment is characterized in that an active layer of the PTFT is not doped with phosphorus after it is doped with boron. In the case doped with phosphorus later, it is needed to dope more boron in advance in order to prevent from inversing into n-type by phosphorus, but this embodiment need not such a trouble. SO that, the dose of boron can be limited to a minimum and the throughput in the manufacturing process is therefore improved.

After the step of FIG. 16C is thus completed, fabrication of the CMOS circuit is continued in accordance with the process of Embodiment 1. The structure to be obtained is the one shown in FIG. 3E but is different from Embodiment 1 in that the source region and the drain region of the PTFT do not contain phosphorus.

The manufacturing process of this embodiment only changes the order of the doping process of the elements belonging to Group 13 or Group 15 in Embodiment 1. Therefore, as for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 11.

Embodiment 16

This embodiment gives a description with reference to FIG. 17 in a case of manufacturing a CMOS circuit in a step order different from the one in Embodiment 1. Other Group 15 elements than phosphorus may be used instead. Other Group 13 elements than boron may be used instead.

First, steps up through the step of FIG. 3A are finished in accordance with the process in Embodiment 1. Thereafter resist masks 48a and 48b are formed and the tantalum film 307 is etched to form a second wiring line 49a and a tantalum film 49b. In this state, the phosphorus (n+) doping step is conducted under the doping conditions of Embodiment 1 to form high concentration impurity regions 50 and 51 in the active layer of the NTFT. (FIG. 17A)

After the resist masks 48a and 48b are removed, resist masks 52a and 52b are formed. The phosphorus (n−) doping step is then conducted under the same doping conditions as Embodiment 1 to form a source region 54, a drain region 55, a LDD region 56 and a channel formation region 57 of the NTFT. (FIG. 17B)

The resist masks 52a and 52b are removed next. Thereafter resist masks 58a to 58d are formed and the tantalum film 49b is etched to form second wiring lines 59a to 59c. In this state, the boron (p++) doping step is conducted under the doping conditions of Embodiment 1 to form a drain region 60, a drain region 61 and a channel formation region 62 of the PTFT. (FIG. 17C)

In this embodiment, an active layer of the PTFT is not doped with phosphorus before it is doped with boron, whereby the dose of boron can be limited to a minimum. The throughput in the manufacturing process is therefore improved.

After the step of FIG. 17C is thus completed, fabrication of the CMOS circuit is continued in accordance with the process of Embodiment 1. The structure to be obtained is the one shown in FIG. 3E.

The manufacturing process of this embodiment only changes the order of the doping process of the elements belonging to Group 13 or Group 15 in Embodiment 1. Therefore, as for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 11.

Embodiment 17

This embodiment gives a description with reference to FIG. 18 in a case of manufacturing a CMOS circuit in a step order different from the one in Embodiment 1. Other Group 15 elements than phosphorus may be used instead. Other Group 13 elements than boron may be used instead.

First, steps up through the step of FIG. 17A are finished in accordance with the process in Embodiment 16 (also referred to Embodiment 1). FIG. 18A shows a state identical with FIG. 17A and the same symbols are used. This is a phosphorus (n+) doping step through which high concentration impurity regions 50 and 51 are formed in the active layer of the NTFT.

The resist masks 48a and 48b are removed next. Thereafter resist masks 63a to 63d are formed and the tantalum film 49b is etched to form second wiring lines 64a to 64c. In this state, the boron (p++) doping step is conducted under the doping conditions of Embodiment 1 to form a drain region 65, a source region 66 and a channel formation region 67 of the PTFT. (FIG. 18B)

The resist masks 63a and 63b are removed next. Thereafter resist masks 68a and 68b are formed and the second wiring line 49a is etched to form a second wiring line 69. In this state, the phosphorus (n−) doping step is conducted under the doping conditions of Embodiment 1 to form a source region 70, a drain region 71, a LDD region 72 and a channel formation region 73 of the NTFT. (FIG. 18C)

This embodiment is characterized in that an active layer of the PTFT is not doped with phosphorus. In the case doped with phosphorus later, it is needed to dope more boron in advance in order to prevent from inversing into n-type by phosphorus, but this embodiment need not such a trouble. SO that, the dose of boron can be limited to a minimum and the throughput in the manufacturing process is therefore improved.

After the step of FIG. 18C is thus completed, fabrication of the CMOS circuit is continued in accordance with the process of Embodiment 1. The structure to be obtained is the one shown in FIG. 3E but is different from Embodiment 1 in that the source region and the drain region of the PTFT do not contain phosphorus.

The manufacturing process of this embodiment only changes the order of the doping process of the elements belonging to Group 13 or Group 15 in Embodiment 1. Therefore, as for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 11.

Embodiment 18

In the case according the manufacturing step of Embodiment 15, the active layer of PTFT is not doped as shown FIGS. 16A, B and C. Therefore, the step shown in Embodiment 12 (the step gettering a catalytic element used in crystallization by phosphorus doped into the source region or the drain region) is impossible to be enforced.

In the case of forming resist masks 38a and 38b in FIG. 16B, however, it becomes possible to dope phosphorus into the active layer of PTFT unless a resist mask is formed on regions to be PTFT.

But in that case, it is on the assumption that PTFT perfectly functions as a mask because only the second wiring line 22b is used as a mask of the doping step. That is, desirably, the thickness of the second wiring line 22b made by a tantalum film is more than 250 nm (preferably more than 350 nm). Less than it, there is the possibility that phosphorus reachs into the channel formation region of PTFT.

The structure of this embodiment can be combined freely with any of the structures of Embodiments 4 through 12.

Embodiment 19

This embodiment gives a description with reference to FIG. 19 in a case of reducing the number of patterning in the manufacturing step shown in Embodiment 15.

First, the state of FIG. 16B is obtained according to the manufacturing step of Embodiment 15. In the state, the second wiring line 39 is etched by the etching method in the regular direction. In this step, the second wiring line 39 is horizontally etched from the side to form the second wiring line 74 with the narrower width. (FIG. 19A)

After the resist masks 38a and 38b are removed, the phosphorus (n–) doping step is conducted under the same doping conditions as Embodiment 1 to form a source region 75, a drain region 76, a LDD region 77 and a channel formation region 78 of the NTFT. At the same time, phosphorus with the same concentration as the LDD region 77 is doped into a drain region 79 and a source region 80 of PTFT. But phosphorus is not doped into the channel formation region of PTFT 81 because the second wiring line which functions as a gate electrode of PTFT performs mask. (FIG. 19B)

After the step of FIG. 19B is thus completed, fabrication of the CMOS circuit is continued in accordance with the process of Embodiment 1. The structure to be obtained is the one shown in FIG. 3E but is different from Embodiment 1 in that the source region and the drain region of the PTFT contain phosphorus with the same concentration as the LDD region of NTFT.

In this embodiment, since the second wiring line functions as a mask in the step of FIG. 19B, the thickness is needed to decide not to dope phosphorus into the channel formation regions 78 and 81. But according to the manufacturing step of this embodiment, the throughput is improved because a sheet of masks of patterning can be reduced.

In the manufacturing process of this embodiment, boron can be changed with other elements belonging to Group 13 or phosphorus can be changed with other elements belonging to Group 15. As for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 11. And combining with Embodiment 18 makes it possible to combine with Embodiment 12.

Embodiment 20

This embodiment gives a description with reference to FIG. 20 in a case of reducing the number of patterning in the manufacturing step shown in Embodiment 16.

First, the state of FIG. 17A is obtained according to the manufacturing step of Embodiment 16. In the state, the second wiring line 49a is etched by the etching method in the regular direction. In this step, the second wiring line 49a is horizontally etched from the side to form the second wiring line 82a with the narrower width. Simultaneously, a tantalum film 49b overlapping PTFT is etched to form a tantalum film 82b. (FIG. 20A)

After the resist masks 48a and 48b are removed, the phosphorus (n–) doping step is conducted under the same doping conditions as Embodiment 1 to form a source region 83, a drain region 84, a LDD region 85 and a channel formation region 86 of the NTFT. (FIG. 20B)

After the step of FIG. 20B is thus completed, the step of FIG. 17C is conducted in accordance with the manufacturing step of Embodiment 16. Then, fabrication of the CMOS circuit is continued in accordance with the process of Embodiment 1. The structure to be obtained is the one shown in FIG. 3E.

In this embodiment, since the second wiring line functions as a mask in the step of FIG. 20B, the thickness is needed to decide not to dope phosphorus into the channel formation region 85 and the active layer of PTFT. But according to the manufacturing step of this embodiment, the throughput is improved because a sheet of masks of patterning can be reduced.

In the manufacturing process of this embodiment, boron can be changed with other elements belonging to Group 13 or phosphorus can be changed with other elements belonging to Group 15. As for the other conditions, please refer to that in Embodiment 1.

The manufacturing process of this embodiment is described taking as an example a CMOS circuit but, needles to say, a pixel matrix circuit is formed at the same time.

The structure of this embodiment can be combined freely with any of the structures of Embodiments 4 through 11. And combining with Embodiment 18 makes it possible to combine with Embodiment 12.

Embodiment 21

This embodiment describes a case in which other materials than a tantalum film are used for first wiring lines and second wiring lines. The description will be given with reference to FIG. 21. This embodiment deals with a technique particularly effective in a manufacturing process that includes a high temperature heat treatment step at 700 to 1150° C., such as the one shown in Embodiment 10.

The first wiring lines are formed prior to formation of an active layer and hence, if the active layer is to be thermally oxidized, the first wiring lines are also subjected to high temperature heat treatment. In this case, an element constituting the first wiring lines is coupled to oxygen to raise a problem of increased wiring line resistance. This embodiment is about a technique for solving that problem.

A substrate used in this embodiment is a quartz substrate 45 having high heat resistance as shown in FIG. 21A. A silicon substrate on which a thermal oxide film is formed, a ceramic substrate on which an insulating film is formed, or the like may of course be used instead.

For the material of first wiring lines 91a to 91c, a tungsten silicide (WSix: x=2 to 25) film 91a1 and a silicon (Si) film 91a2 are layered to form a laminate. The layer order may be reverse, or the laminate may have a three-layer structure in which silicon films sandwich a tungsten silicide film.

FIG. 21B shows a pixel matrix circuit, in this case the first wiring line 92a to 92c and the capacitor wiring line 93 also are a laminate of a tungsten silicide film and a silicon film.

With these materials, the wiring line resistance is not increased in the tungsten silicide film 91a1 after the high temperature heat treatment step at 700 to 1150° C. This is because excess silicon contained in the tungsten silicide film preemptively couples with oxygen and prevents oxygen from coupling with tungsten.

Other metal silicide films, for example, a molybdenum silicide (MoSix) film, a titanium silicide (TiSix) film, a cobalt silicide (CoSix) film, a tantalum silicide (TaSix) film, etc., may be used instead of the tungsten silicide film.

If a simple metal film (typically, a tantalum film, a titanium film, a tungsten film, or a molybdenum film) is used for the first wiring lines, a silicon film is provided so as to contact with the top face and/or the bottom face of the simple metal film. This prevents oxidization of the simple metal film and an increase in wiring line resistance.

If the simple metal film such as a tantalum film or a tungsten film is sandwiched between silicon films forming a three-layer structure, the first wiring lines formed can withstand a high temperature process as the one used in this embodiment.

The structure of this embodiment can be combined freely with any of the structures of Embodiments 1 through 20.

Embodiment 22

This embodiment shows a case in which different structures are given to TFTs arranged in driver circuits (or other signal processing circuits) in accordance with the difference in operation voltage for the optimal circuit design.

The CMOS circuit shown in FIG. 1A is used to construct a gate driver circuit, a source driver circuit, and other signal processing circuits of an AM-LCD. The operation voltage of the CMOS circuit varies depending on which of these circuits it constitutes. For example, shift register circuits 702a and 703a in FIG. 7 have a low operation voltage, about 5 v, and are required to operate at high speed whereas buffer circuits 702c and 703c have a high operation voltage of 16 to 20 V.

In the case of a shift register circuit, hot carrier injection hardly matters and no serious problem is caused if it does not have the GOLD structure because of its low operation voltage. On the contrary, sometimes it is preferred not to provide a first wiring line if formation of a parasitic capacitance between a first wiring line (subordinate gate wiring line) and an active layer is to be avoided. In the case of a buffer circuit, on the other hand, its high operation voltage makes hot carrier injection countermeasures indispensable. Then the structure shown in FIG. 1A is effective.

As described above, there are cases where one circuit in a driver circuit employs the CMOS circuit of FIG. 1A whereas another circuit in the same driver circuit uses a CMOS circuit with an NTFT that has an ordinary LDD structure in accordance with difference in operation voltage between the one circuit and the other circuit while sharing the same substrate.

Other signal processing circuits than a driver circuit (a D/A converter circuit, a γ correction circuit, a signal divider circuit, or the like) are low in operation voltage and hence may use a CMOS circuit having an NTFT that has an ordinary LDD structure.

The structure of this embodiment can be combined freely with any of Embodiments 1 through 21.

Embodiment 23

In the CMOS circuit shown in FIG. 1, the first wiring line 102a is provided in the NTFT but not in the PTFT. However, a conductive layer on the same layer as the first wiring line may be provided under the active layer of the PTFT.

The conductive layer to be placed under the active layer of the PTFT has such an electric potential as not to influence the operation of the PTFT (specifically, the lowest power supply electric potential or to the same effect) or is kept to a floating state. That is, the conductive layer is prevented from doing no other function than the one as a light-shielding layer.

The pixel matrix circuit shown in FIG. 2 is an NTFT. However, the pixel matrix circuit may be a PTFT if a first wiring line functioning as a light-shielding layer is provided under its active layer.

The structure of this embodiment can be combined freely with any of Embodiments 1 through 22.

Embodiment 24

This embodiment describes a case in which the thickness of a first insulating layer and/or second insulating layer is varied to reflect a difference in operation voltage.

In an AM-LCD shown in FIG. 6, a pixel matrix circuit 607 has an operation voltage of 16 V whereas the operation voltage of driver circuits 603 and 604, or a signal processing circuit 605 is 10 V or less, or even 5 V or less.

Specifically, level shifter circuits 702b and 703b, buffer circuits 702c and 703c, and a sampling circuit 703d in FIG. 7 have an operation voltage close to that of a pixel matrix circuit 701 (16 to 20 V). On the other hand, shift register circuits 702a and 703a or a signal processing circuit (not shown in the drawing) have a low operation voltage of 5 to 10 V.

For the shift register circuit and signal processing circuit as above, high speed operation is the most important factor and hence it is effective to make the gate insulating film as thin as possible to increase the operation speed of the TFT.

On the other hand, the high speed operation ability is not required much for the buffer circuit and the pixel matrix circuit and hence forming a thick gate insulating film to improve the withstand voltage characteristic is effective.

Thus, when the operation voltage is different and specifications required for circuits are accordingly different, it is effective to vary the thickness of the gate insulating film to suit a required specification. Since the first insulating layer and the second insulating layer in the NTFT structure of the present invention can function as gate insulating films, the thickness thereof can be changed to suit the respective circuits.

For example, in a circuit having a low operation voltage and required to operate at high speed, such as a shift register circuit and a signal processing circuit (signal divider circuit or the like), it is effective to make the first insulating layer thick (200 to 400 nm) while making the second insulating layer thin (10 to 30 nm). If the first insulating layer is as thin as the second insulating layer, the operation speed is improved but the parasitic capacitance is increased to impair the frequency characteristic, which is not desirable. In some cases, the first wiring line may not be provided in a shift register circuit or the like as in Embodiment 22.

When the operation voltage is high as in a buffer circuit, a sampling circuit, a pixel matrix circuit, or the like, it is desirable to make the second insulating layer as thick as 100 to 200 nm to enhance the withstand voltage characteristics as a gate insulating film.

In a pixel matrix circuit, the influence of the first wiring line has to be as small as possible and hence the first insulating layer may be as thick as 200 to 400 nm. This makes it possible to for the first wiring line provided in the pixel TFT to function as a light-shielding layer.

As described above, it is effective to vary the thickness of the gate insulating film (the first insulating layer and/or the second insulating layer) between circuits that are different from one another in operation voltage.

The structure of this embodiment can be combined freely with any of Embodiments 1 through 23.

Embodiment 25

The TFT structure of the present invention can be applied not only to electro-optical devices such as AM-LCDs but to semiconductor circuits of every kind. It may be applied to microprocessors such as RISC processors and ASIC processors, to signal processing circuits such as D/A converters, and to high frequency circuits for portable equipment (cellular phones including PHS, and mobile computers).

It is possible to obtain a semiconductor device having a three-dimensional structure in which an interlayer insulating film is formed on a conventional MOSFET and the present invention is applied thereto to form a semiconductor circuit. The present invention thus is applicable to all of the semiconductor devices that currently employ LSIs. The present invention may be applied to the SOI structure (a TFT structure using a single crystal semiconductor thin film) such as SIMOX, Smart-Cut (trade name of SOITEC), and ELT-RAN (trade name of Canon, Inc.).

The semiconductor circuits of this embodiment can be obtained by any structure resulting from combinations of Embodiments 1 through 24.

Embodiment 26

A CMOS circuit and pixel matrix circuit formed by carrying out the present invention can be applied to various electro-optical devices and semiconductor circuits. That is, the present invention is applicable to all of electronic equipment that incorporates those electro-optical devices and semiconductor circuits as components.

Given as such electronic equipment are video cameras, digital cameras, projectors, projection TVs, head mounted displays (goggle type displays), automobile navigation systems, personal computers, portable information terminals (mobile computers, cellular phones, electronic books or the like), etc. Examples of those are shown in FIG. 22.

FIG. 22A shows a cellular phone, which is composed of a main body 2001, an audio output unit 2002, an audio input unit 2003, a display device 2004, operation switches 2005, and an antenna 2006. The present invention is applicable to the audio output unit 2002, the audio input unit 2003, the display device 2004, and other signal controlling circuits.

FIG. 22B shows a video camera, which is composed of a main body 2101, a display device 2102, an audio input unit 2103, operation switches 2104, a battery 2105, and an image receiving unit 2106. The present invention is applicable to the display device 2102, the audio input unit 2103, and other signal controlling circuits.

FIG. 22C shows a mobile computer, which is composed of a main body 2201, a camera unit 2202, an image receiving unit 2203, operation switches 2204, and a display device 2205. The present invention is applicable to the display device 2205 and other signal controlling circuits.

FIG. 22D shows a goggle type display, which is composed of a main body 2301, display devices 2302, and arm units 2303. The present invention is applicable to the display devices 2302 and other signal controlling circuits.

FIG. 22E shows a rear projector, which is composed of a main body 2401, a light source 2402, a display device 2403, a polarization beam splitter 2404, reflectors 2405 and 2406, and a screen 2407. The present invention is applicable to the display device 2403 and other signal controlling circuits.

FIG. 22F shows a front projector, which is composed of a main body 2501, a light source 2502, a display device 2503, an optical system 2504, and a screen 2505. The present invention is applicable to the display device 2502 and other signal controlling circuits.

As described above, the application range of the present invention is so wide that it is applicable to electronic equipment of every field. The electronic equipment of this embodiment can be obtained by any structure resulting from combinations of Embodiments 1 through 25.

[Effect of the Invention]

The present invention is characterized in that the same NTFT can form both the GOLD structure and the LDD structure and which one is to form is determined by controlling the voltage of a first wiring line provided under an active layer. In other words, the GOLD structure and the LDD structure can be formed on the same substrate without increasing the number of steps or complicating the process.

Therefore circuits having optimal functions can be arranged in accordance with the respective specifications required for the circuits, thus greatly improving the performance and reliability of a semiconductor device such as an AM-LCD and electronic equipment that has the AM-LCD as a display.

BRIEF DESCRIPTION OF THE INVENTION

[FIG. 1] shows a structure of a CMOS circuit.

[FIG. 2] shows a structure of a pixel matrix circuit.

[FIG. 3] shows a process of manufacturing a CMOS circuit.

[FIG. 4] shows a process of manufacturing a pixel matrix circuit.

[FIG. 5] shows a process of manufacturing a pixel matrix circuit.

[FIG. 6] shows the outside appearance of AM-LCD.

[FIG. 7] shows a block structure of AM-LCD.

[FIG. 8] shows a structure of a CMOS circuit or a pixel matrix circuit.

[FIG. 9] shows a process of manufacturing a pixel matrix circuit (specially a storage capacitor.

[FIG. 10] shows a structure of a CMOS circuit or a pixel matrix circuit.

[FIG. 11] shows a structure of a CMOS circuit or a pixel matrix circuit.

[FIG. 12] shows a structure of a CMOS circuit.

[FIG. 13] shows a process of manufacturing a CMOS circuit.

[FIG. 14] shows a process of manufacturing a CMOS circuit.

[FIG. 15] shows a process of manufacturing a CMOS circuit.

[FIG. 16] shows a process of manufacturing a CMOS circuit.

[FIG. 17] shows a process of manufacturing a CMOS circuit.

[FIG. 18] shows a process of manufacturing a CMOS circuit.

[FIG. 19] shows a process of manufacturing a CMOS circuit.

[FIG. 20] shows a process of manufacturing a CMOS circuit.

[FIG. 21] shows a structure of a CMOS circuit or a pixel matrix circuit.

[FIG. 22] shows an example of an electric device.

DESCRIPTION OF A MARK

101 A substrate
102a, 102b and 102c First wiring lines
103 A first insulating layer
104 and 105 Active layers
106 A second insulating layer
107a, 107b, 107c and 107d Second wiring lines
(107a1, 107b1, 107c1 and 107d1 First conductive layers
107a2, 107b2, 107c2 and 107d2 Second conductive layers
107d3 A third conductive layer)
108 A first interlayer insulating layer
109~111 Third wiring lines
(109, 110 Source wiring lines
111 A drain wiring line)
201 A substrate
202a, 202b and 202c First wiring lines
203 A first insulating layer
204 An active layer
205 A second insulating layer
206a, 206b and 206c Second wiring lines
(206a1, 206b1 and 206c1 First conductive layers
206a2, 206b2 and 206c2 Second conductive layers
206a3 A second conductive layer)
207 A capacitor wiring line
(207a A first conductive layer
207b A second conductive layer)
208 A first interlayer insulating layer
209 A source wiring line
210 A drain wiring line
211 A second interlayer insulating layer
212 Black masks
213 A third interlayer insulating layer
214 A pixel electrode
215 and 216 Channel formation regions
601 A substrate with an insulating surface
602 A pixel matrix circuit
603 A source driver circuit
604 A gate drivier circuit
605 A signal processing circuit
606 An FPC
1007 An opposite substrate
701 A pixel matrix circuit
702a and 703a Shift register circuits
702b and 703b Level shifter circuits
702c and 703c Buffer circuits
703d A sampling circuit
704 A precharge circuit
2001 A main body
2002 An audio output unit
2003 An audio input unit
2004 A display device
2005 Operation switches
2006 An antenna
2101 A main body
2102 A display device
2103 An audio input unit
2104 Operation switches
2105 A battery
2106 An image receiving unit
2201 A main body
2202 A camera unit
2203 An image receiving unit
2204 Operation switches
2205 A display device
2301 A main body
2302 Display devices
2303 Arm units
2401 A main body
2402 A light source
2403 A display device
2404 A polarization beam splitter
2405 Reflector
2406 Reflector
2407 A screen
2501 A main body
2502 A light source
2503 A display device
2504 An optical system
2505 A screen

Figure 1A:
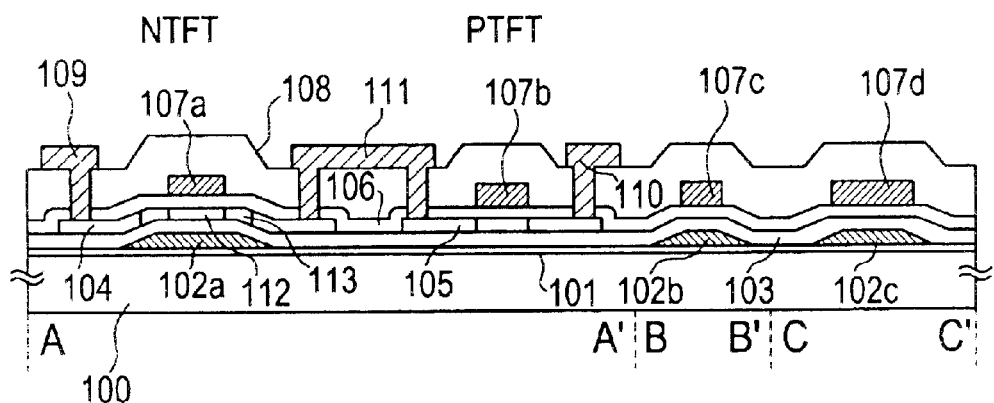
Figure 1B:
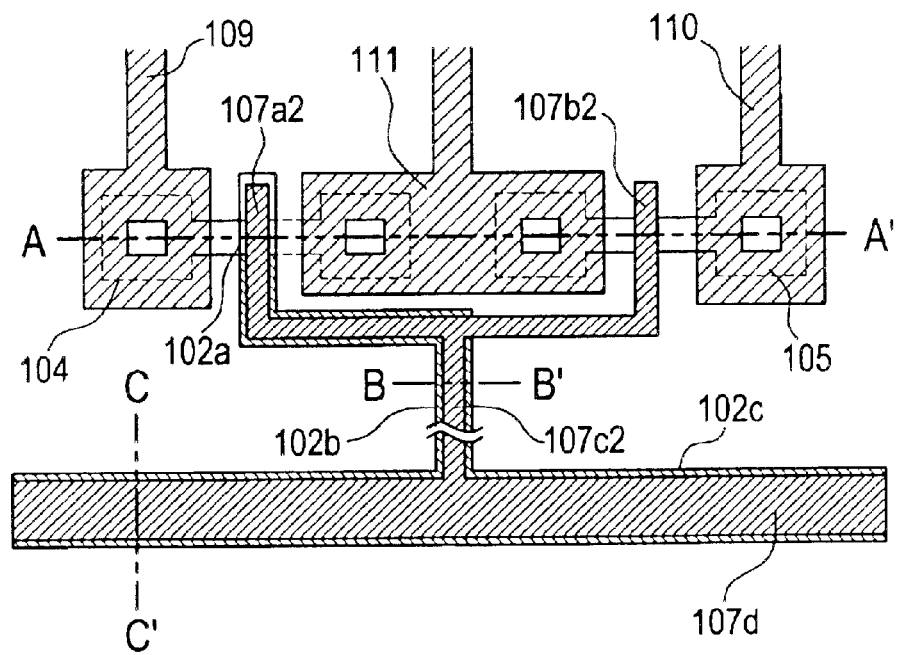
Figure 2A:
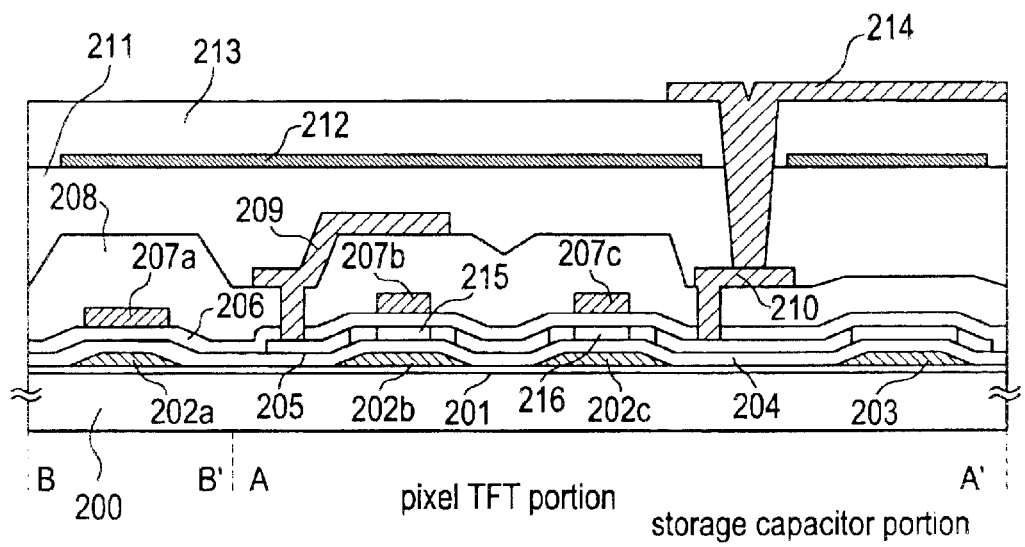
[FIG. 2]
(A) A pixel TFT portion
    A storage capacitor portion
(B) A storage capacitor portion
[FIG. 3]
(A) A phosphorus doping step
(B) A boron doping step
(C) A back side exposure step, A phosphorus doping step
[FIG. 9]
(A) A pixel TFT portion
    A storage capacitor portion
(B) A pixel TFT portion
    A storage capacitor portion
Figure 2B:
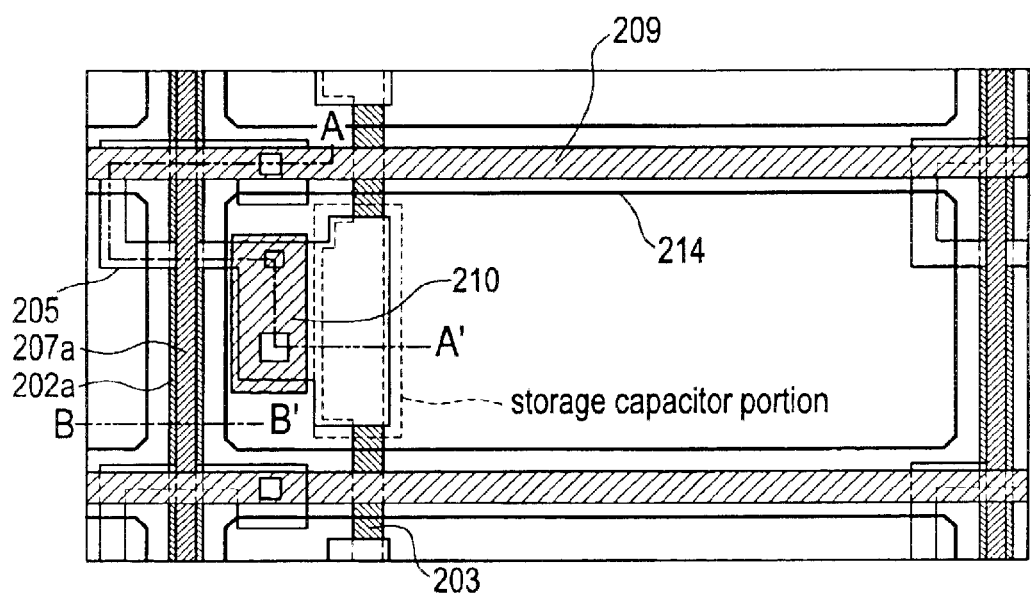
Figure 3A:
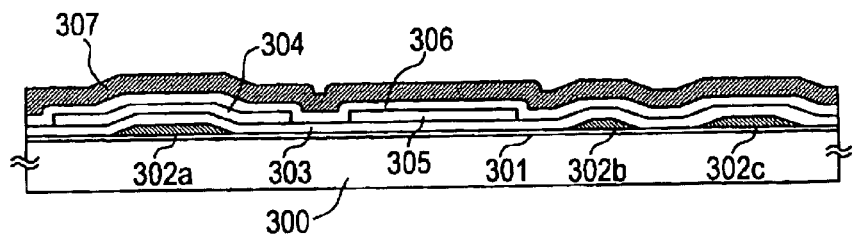
Figure 3B:
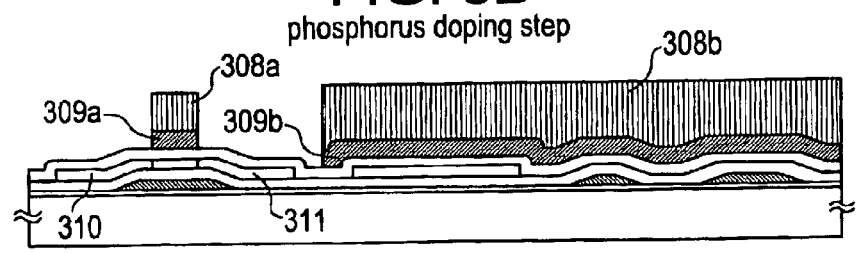
Figure 3C:
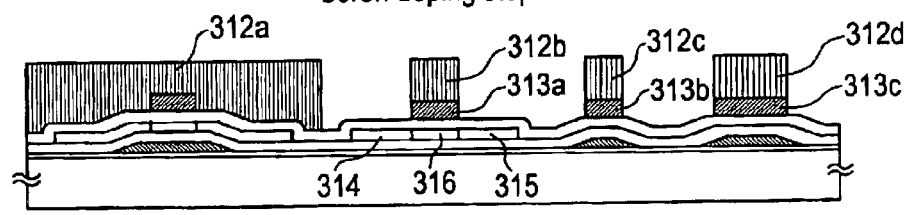
Figure 3D:
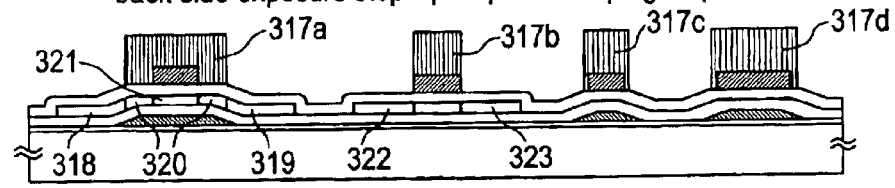
Figure 3E:
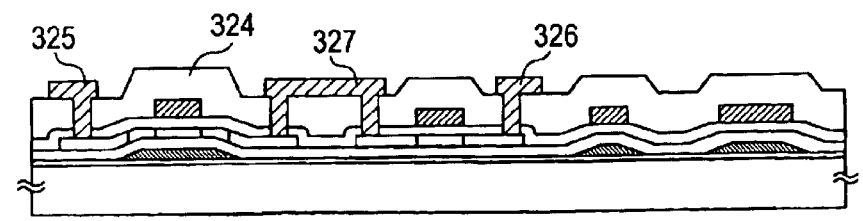
Figure 4A:
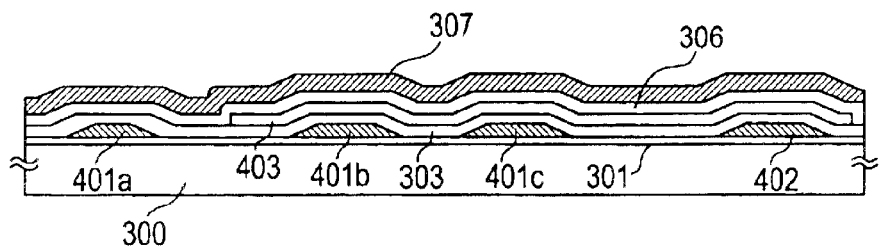
Figure 4B:
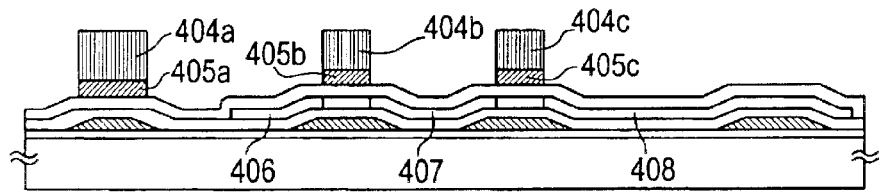
Figure 4C:
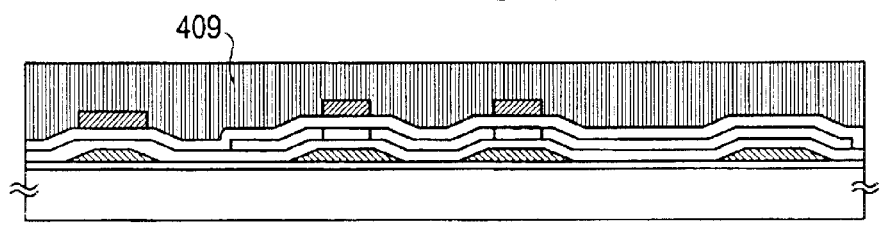
Figure 4D:
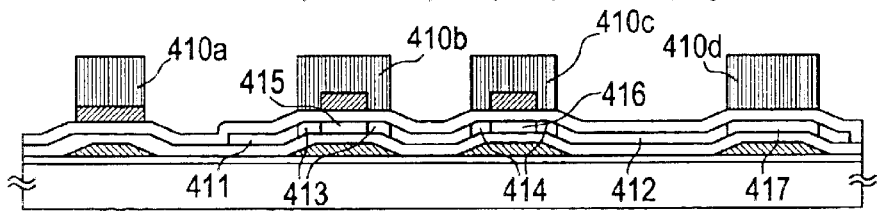
Figure 4E:
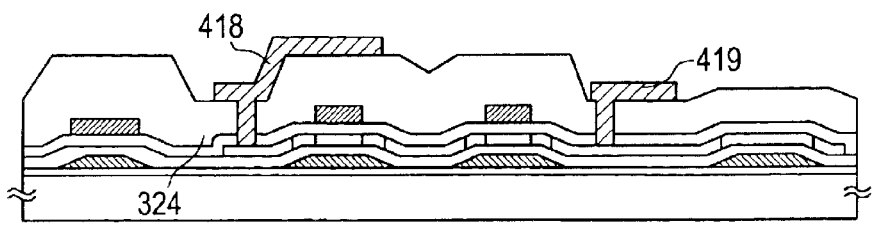
Figure 5A:
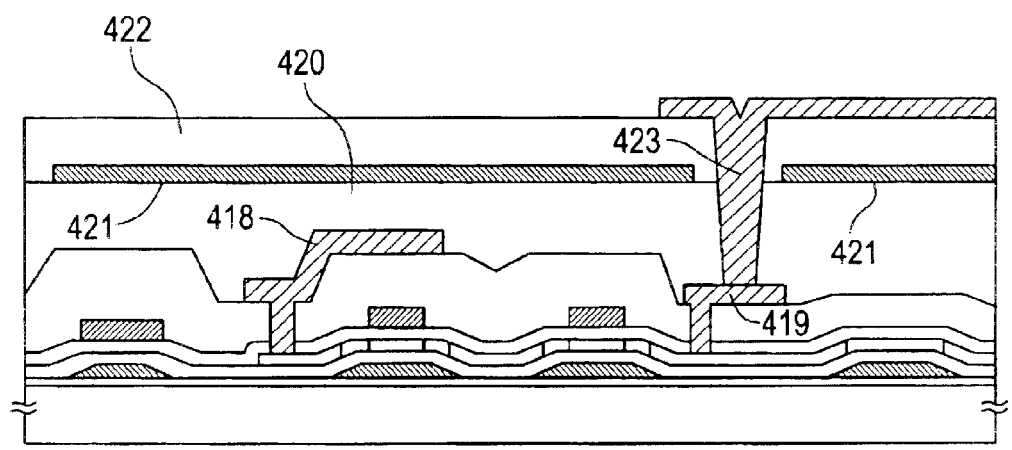
Figure 5B:
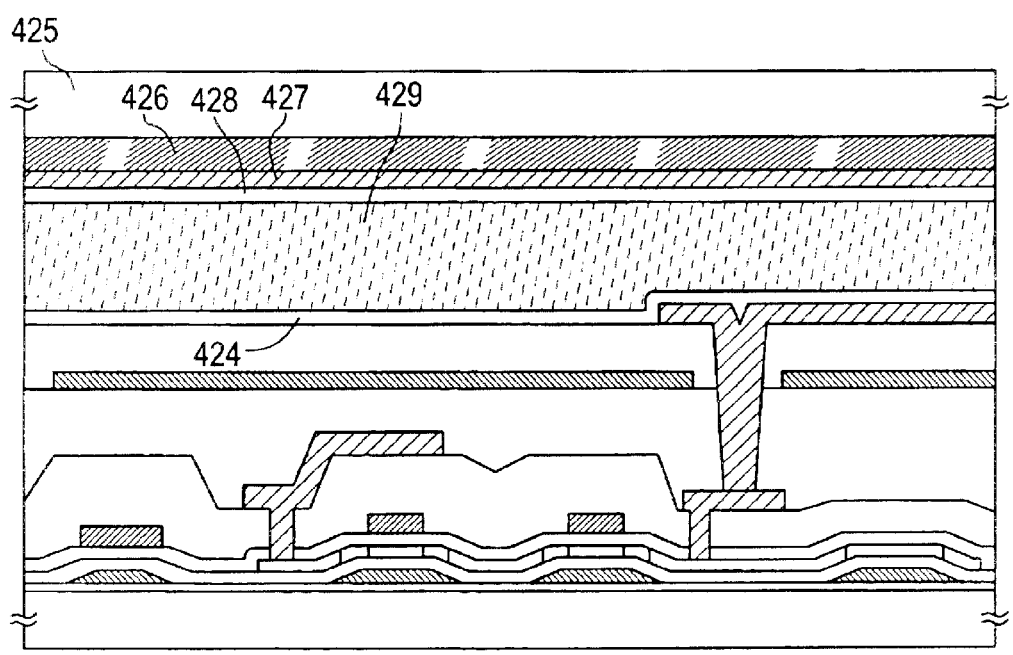
Figure 6:
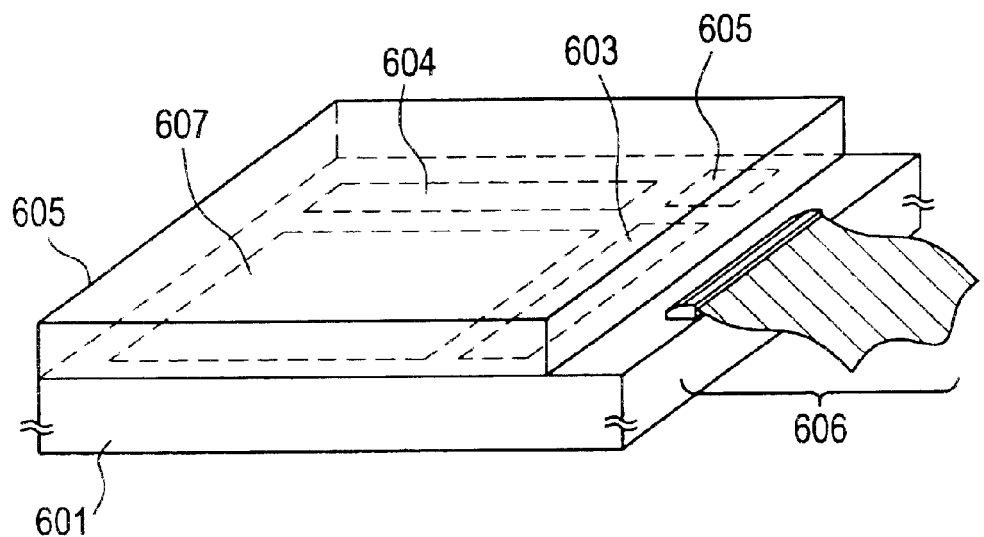
Figure 7:
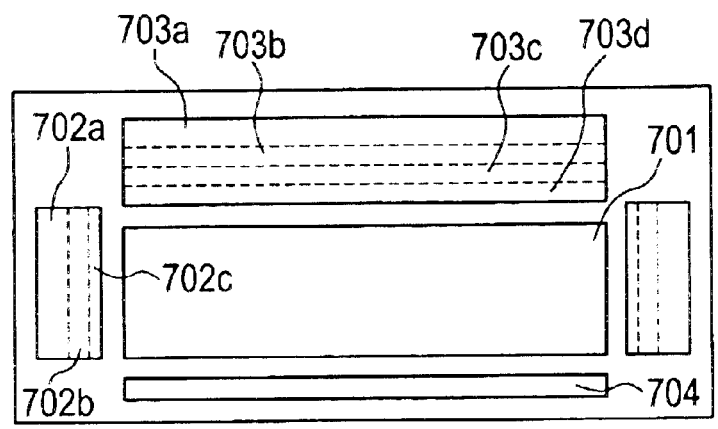
Figure 8A:
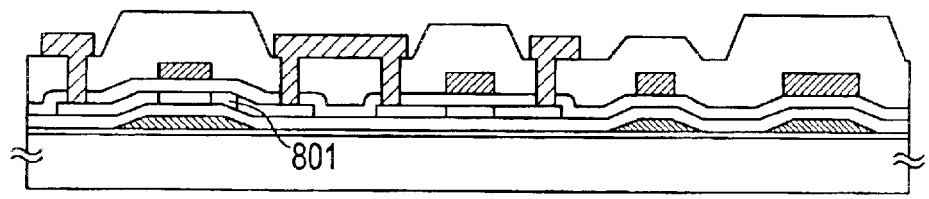
Figure 8B:
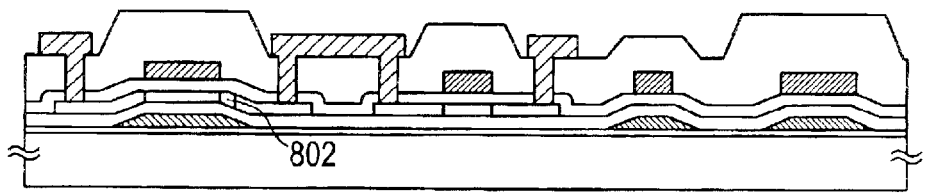
Figure 8C:
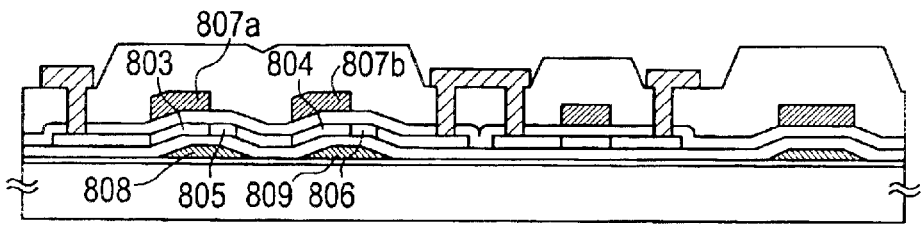
Figure 8D:
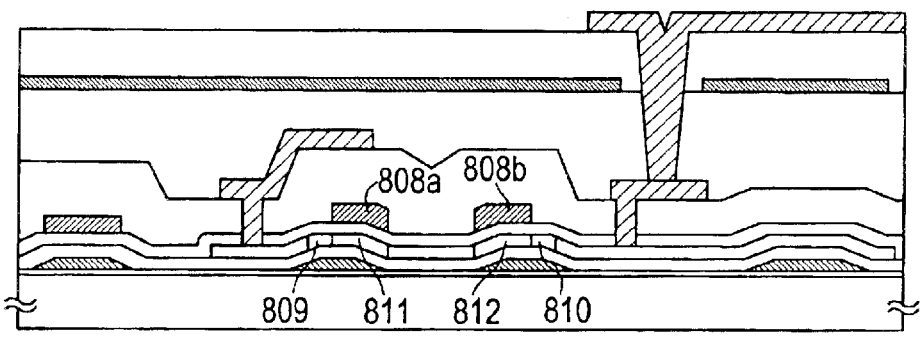
Figure 9A:
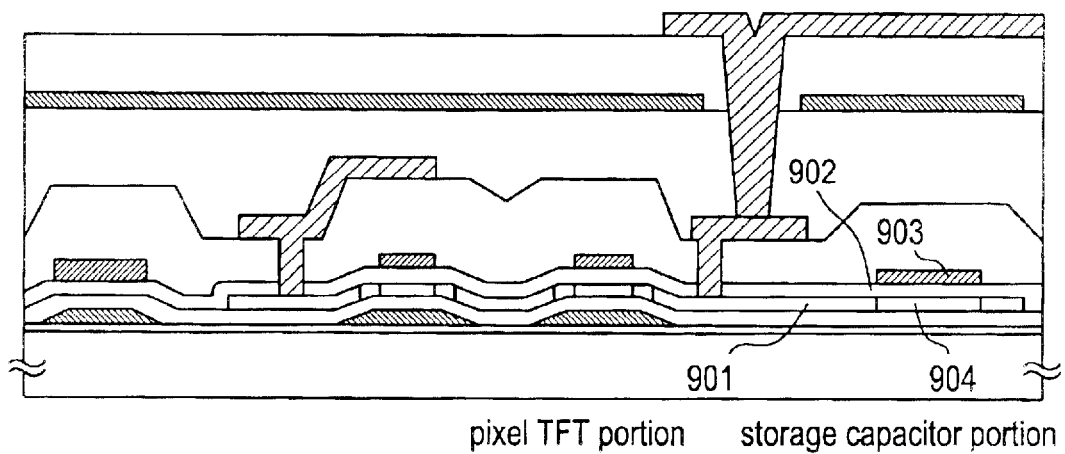
Figure 9B:
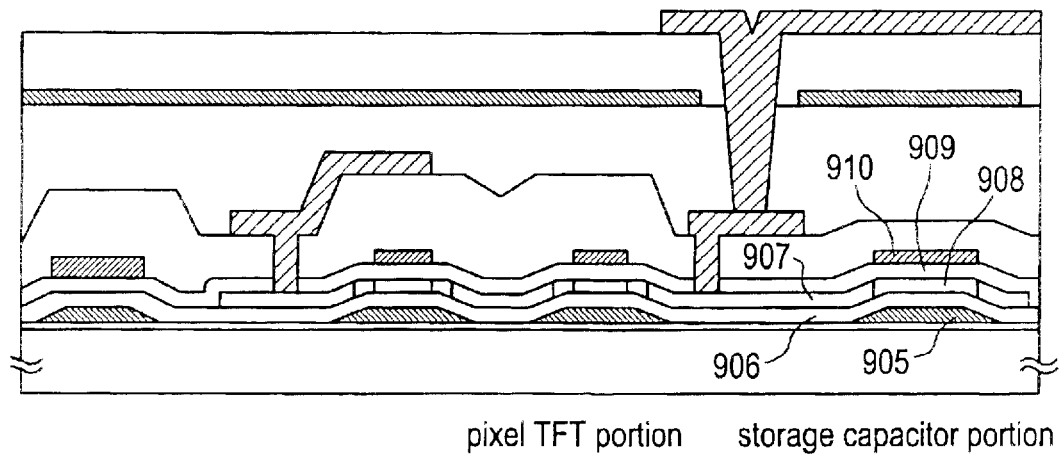
Figure 10A:
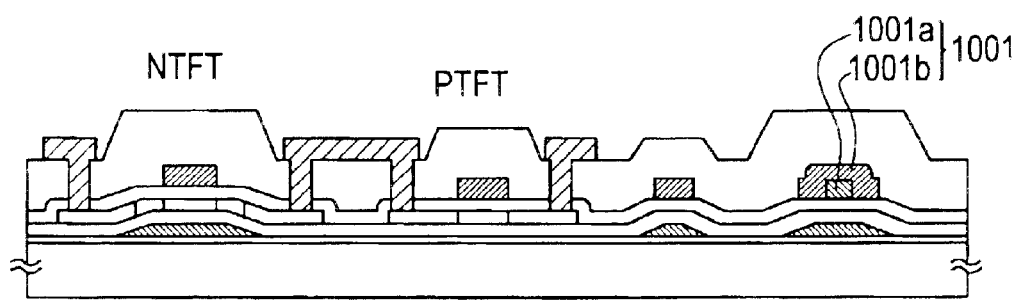
[FIG. 10]
(B) A pixel TFT portion
  A storage capacitor portion
[FIG. 11]
(B) A pixel TFT portion
  A storage capacitor portion
[FIG. 12]
(A) A gettering step by phosphorus
(C) A boron doping step
(D) A back side exposure step, A phosphorus doping step
Figure 10B:
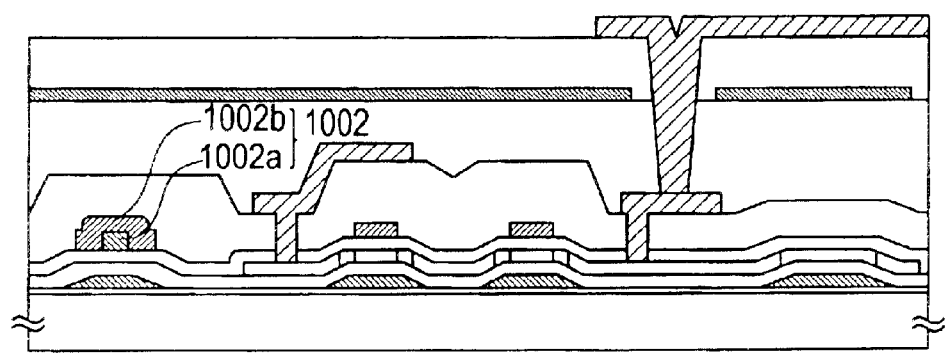
Figure 11A:
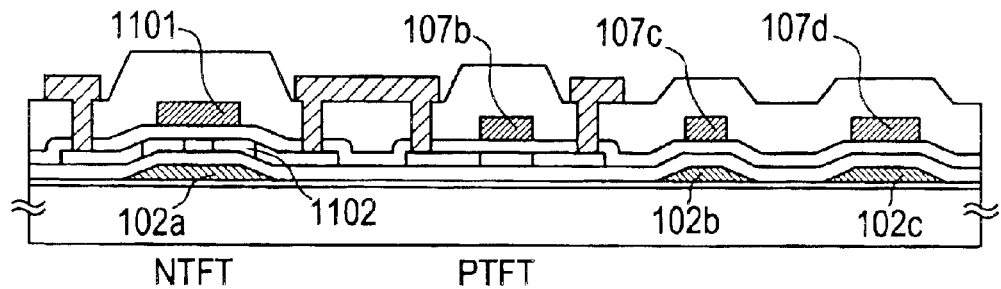
Figure 11B:
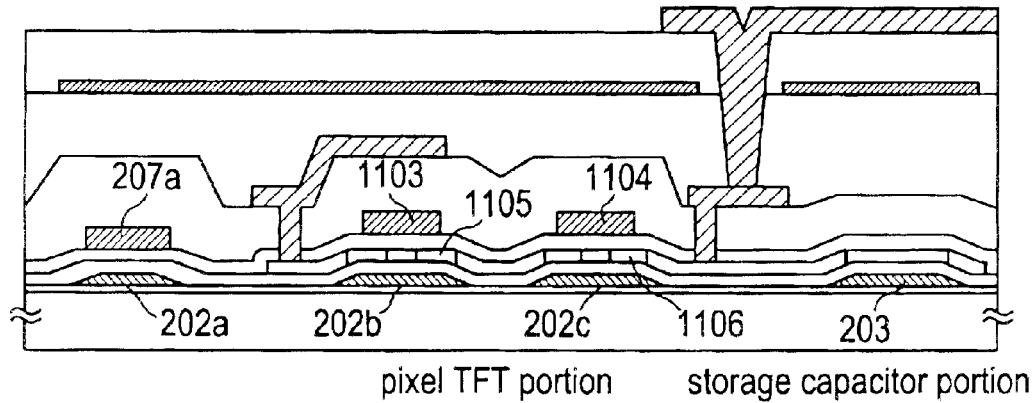
Figure 12:
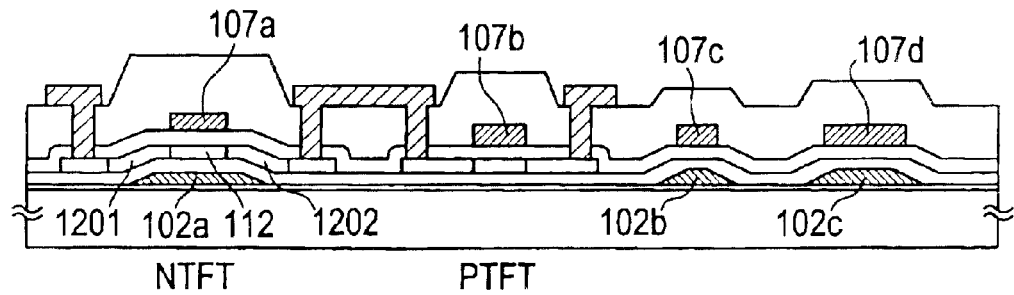
Figure 13A:
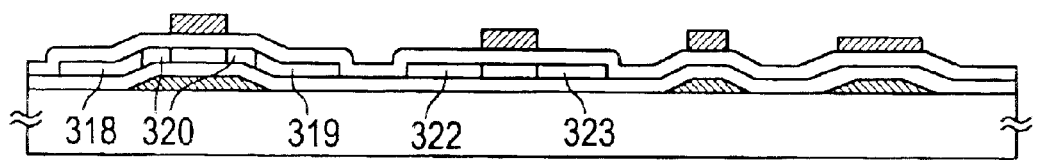
Figure 13B:
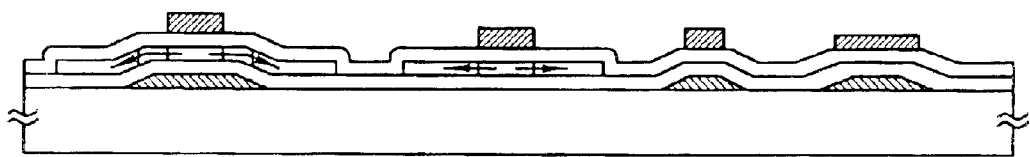
Figure 14A:
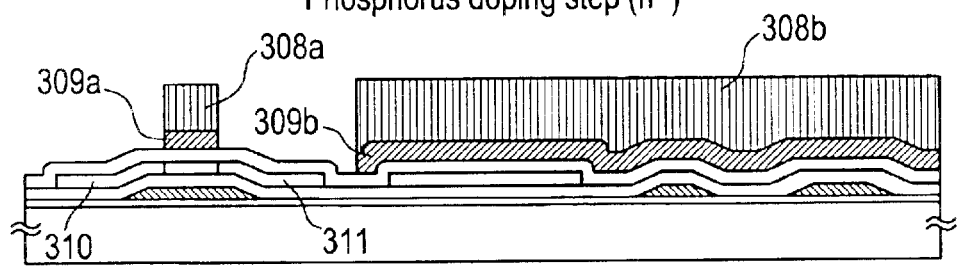
Figure 14B:
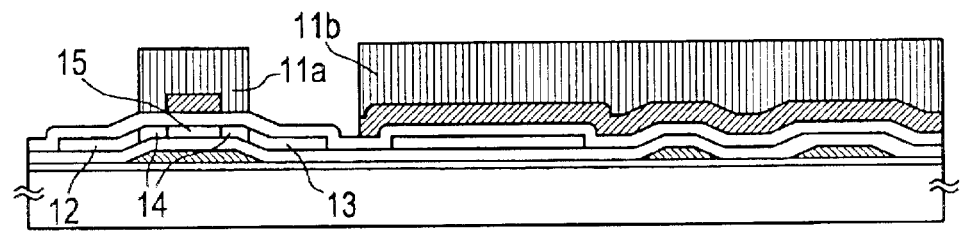
Figure 14C:
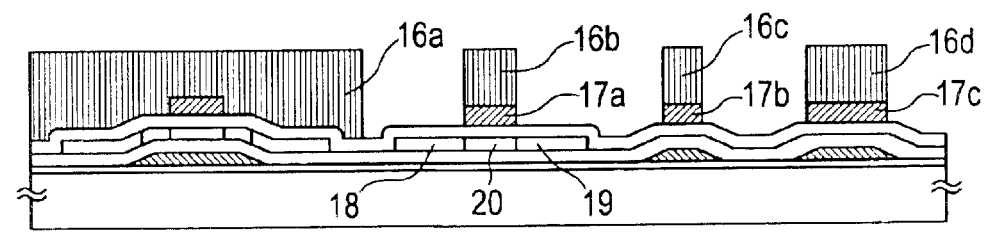
Figure 15A:
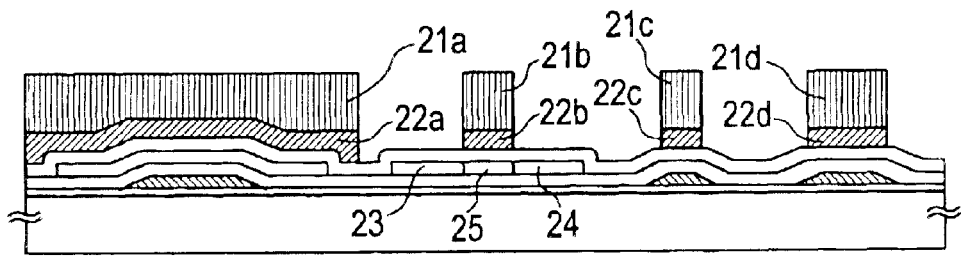
Figure 15B:
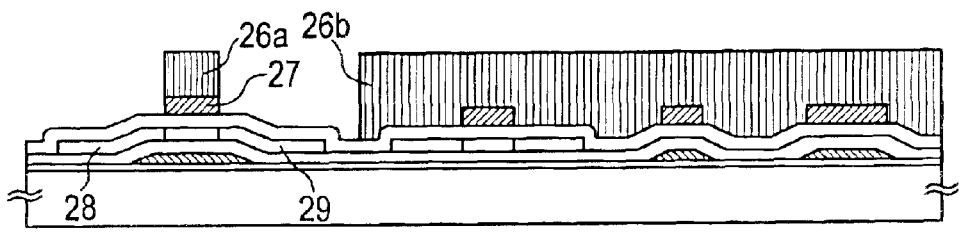
Figure 15C:
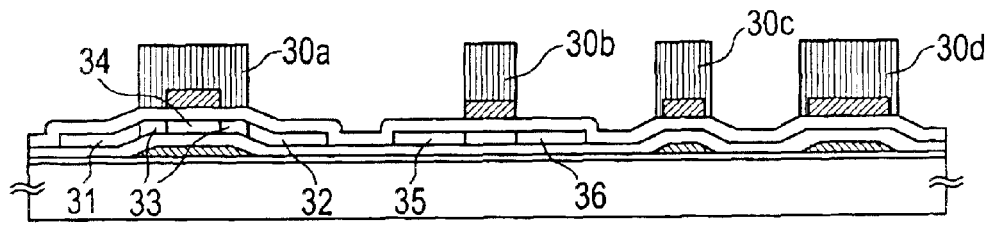
Figure 16A:
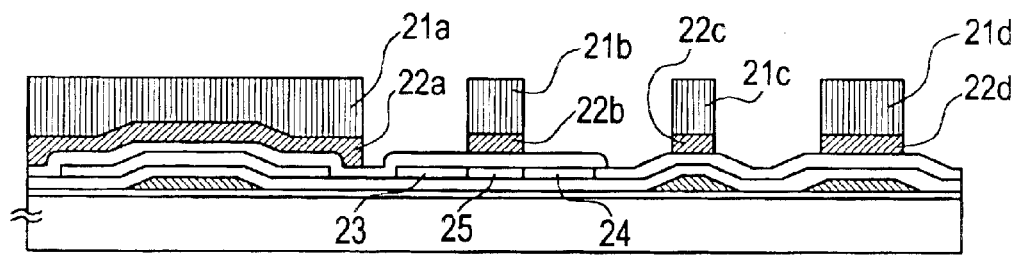
Figure 16B:
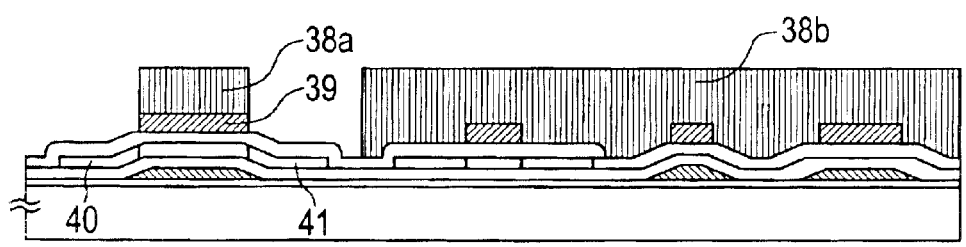
Figure 16C:
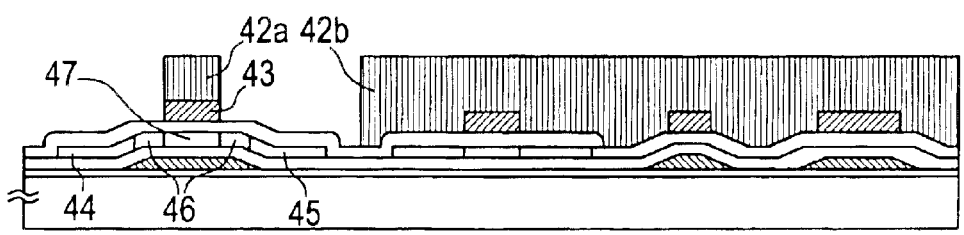
Figure 17A:
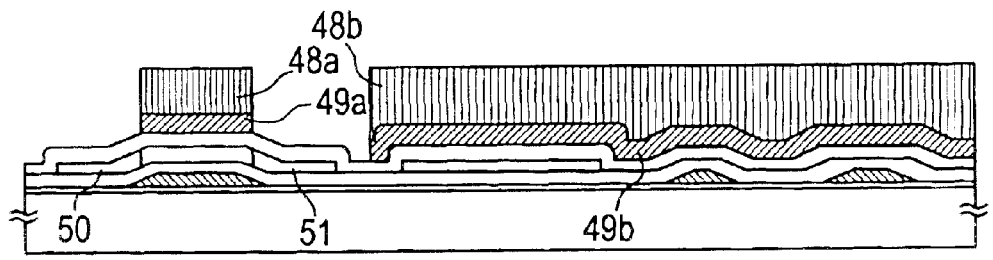
Figure 17B:
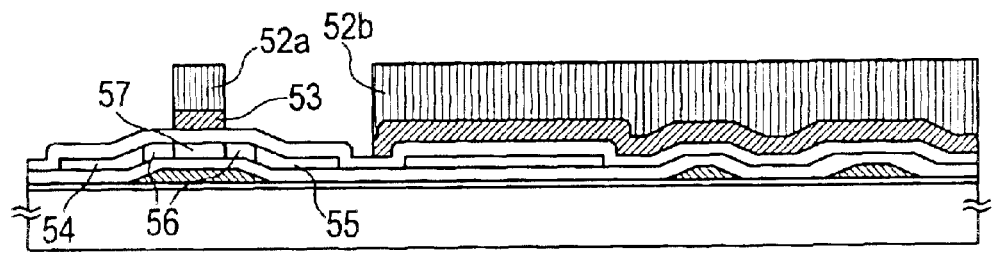
Figure 17C:
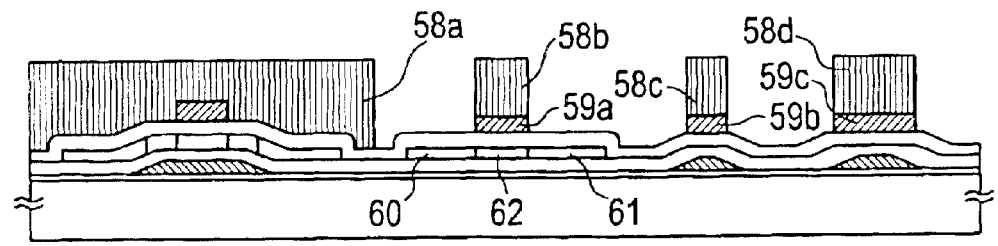
Figure 18A:
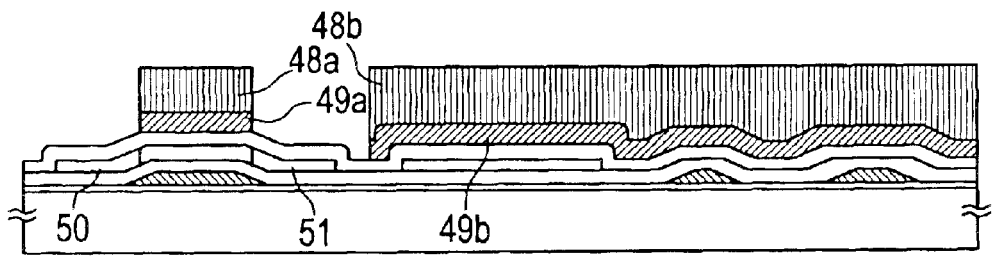
Figure 18B:
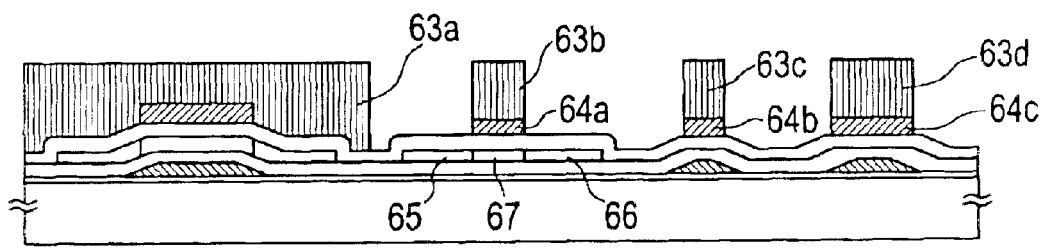
Figure 18C:
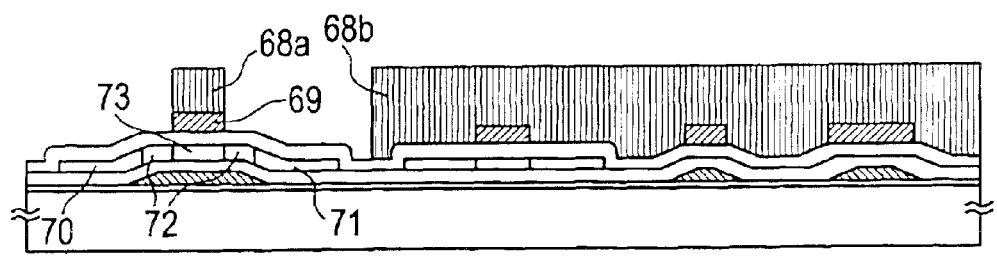
Figure 19A:
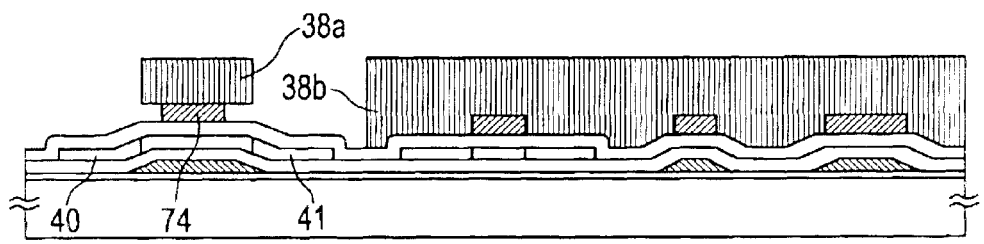
Figure 19B:
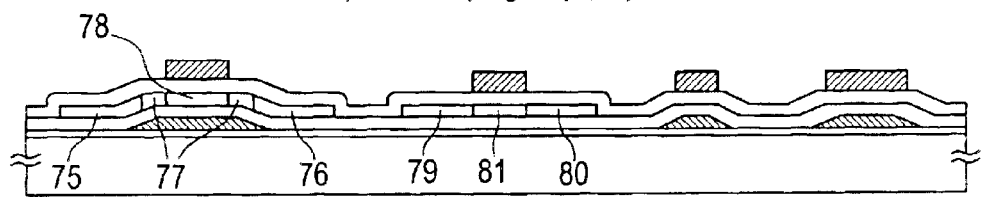
Figure 20A:
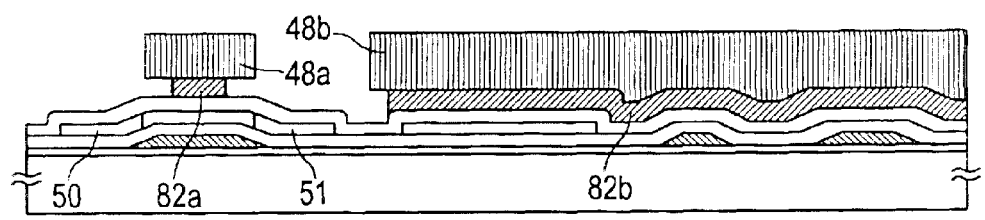
Figure 20B:
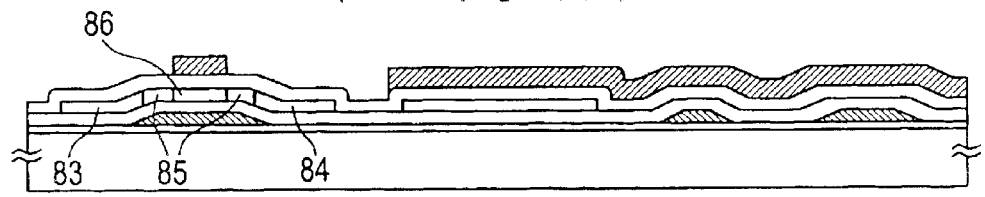
Figure 21A:
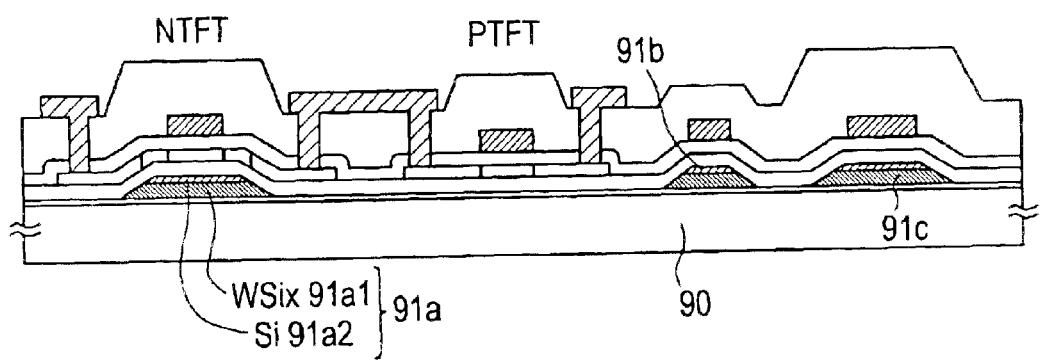
Figure 21B:
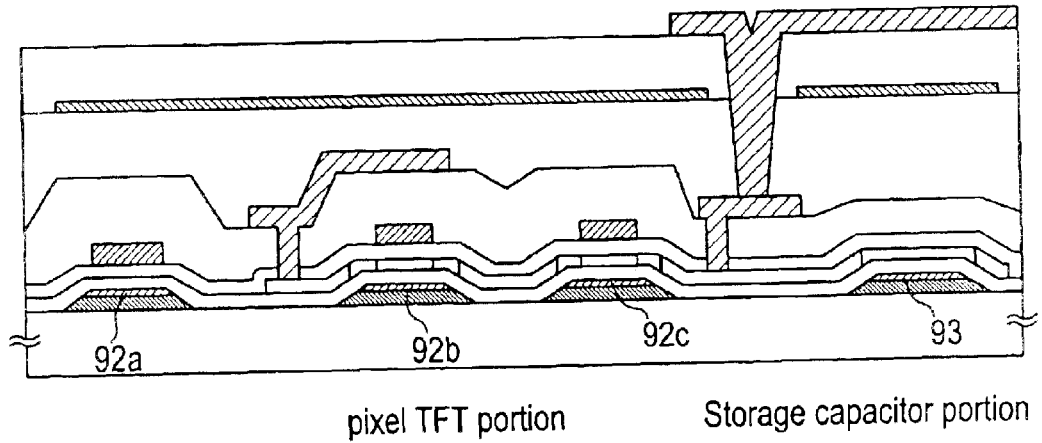
Figure 22A:
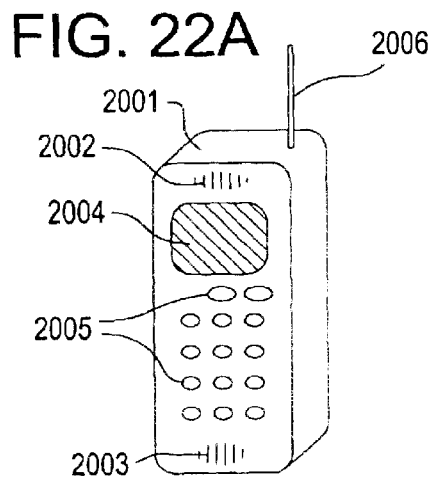
Figure 22B:
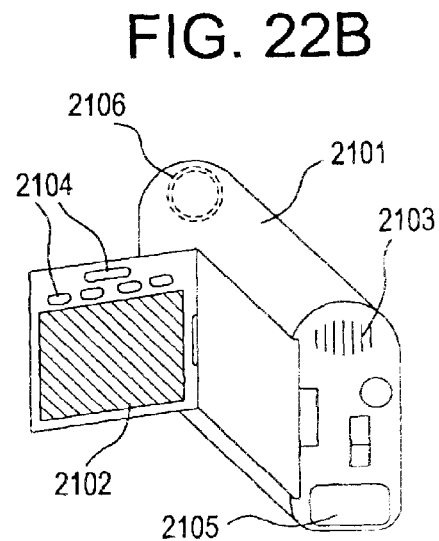
Figure 22C:
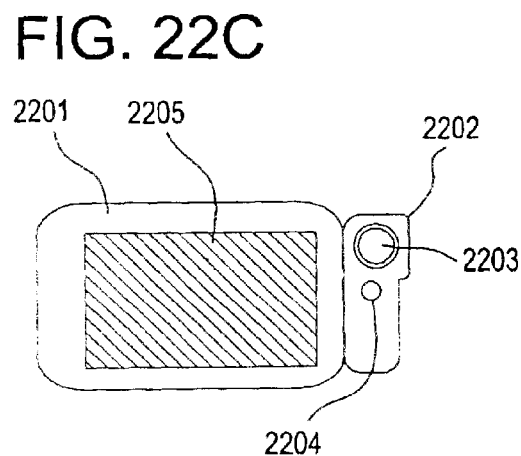
Figure 22D:
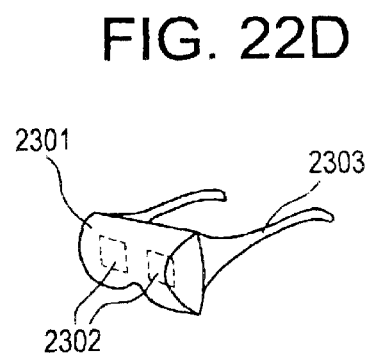
Figure 22E:
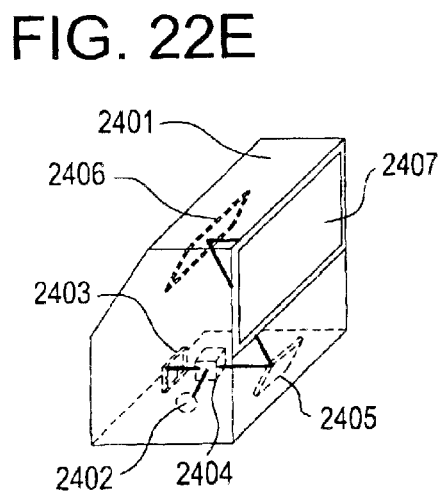
Figure 22F:
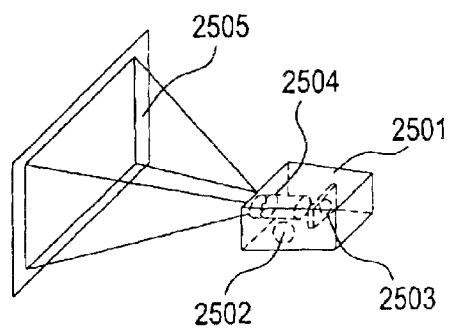

What is claimed is:

1. A method of manufacturing a semiconductor device including an n-channel TFT and a p-channel TFT comprising the steps of:
   forming a first wiring line on a substrate,
   forming a first insulating layer on the first wiring line,
   forming an active layer of the n-channel TFT and an active layer of the p-channel TFT on the first insulating layer, wherein the active layer of the n-channel TFT is located over the first wiring line with the first insulating film interposed therebetween and the active layer of the p-channel TFT does not overlap any portion of the first wiring line,
   forming a second insulating layer on the active layer of the n-channel TFT and the active layer of the p-channel TFT,
   forming a second wiring line on the second insulating layer, and
   forming a LDD region in the active layer of the n-channel TFT;
   wherein the LDD region is provided overlapping the first wiring line and not overlapping the second wiring line.

2. The method of manufacturing the semiconductor device according to claim 1,
   wherein each of the first wiring line and the second wiring line is made of a conductive film containing an element selected from the group consisting of tantalum (Ta), chromium (Cr), titanium (Ti), tungsten (W), molybdenum (Mo), and silicon (Si).

3. A method of manufacturing a semiconductor device comprising the steps of:
   forming a first conductive film over a substrate;
   patterning the first conductive film to form at least one first wiring line;
   forming a first insulating film over the first wiring line and the substrate;
   forming a first semiconductor island and a second semiconductor island, wherein the first semiconductor island is located over said the first wiring line with the first insulating film interposed therebetween and the second semiconductor island does not overlap any portion of the first conductive film;
   forming a pair of first N-type impurity regions in the first semiconductor island with a first channel region therebetween;
   forming at least one second N-type impurity region between the first channel region and the first N-type impurity regions, wherein a concentration of an N-type impurity in the second N-type impurity region is lower than that in the first N-type impurity regions;
   forming a pair of P-type impurity regions in the second semiconductor island with a second channel region therebetween;
   forming a second insulating film over said the first semiconductor island and the second semiconductor island; and
   forming a second wiring line over the first channel region of the first semiconductor island and a third wiring line over the second channel region of the second semiconductor island,
   wherein there is an overlap between the first wiring line and the second N-type impurity region of the first semiconductor island and there is no overlap between the second wiring line and the second N-type impurity region.

4. The method of manufacturing the semiconductor device according to claim 3,
   wherein the first conductive film comprises a material selected from the group consisting of tantalum (Ta), chromium (Cr), titanium (Ti), tungsten (W), molybdenum (Mo), and silicon (Si).

5. The method of manufacturing the semiconductor device according to claim 3,
   wherein the second wiring line and the third wiring line are formed by patterning a second conductive film, the second conductive film comprising a material selected from the group consisting of tantalum (Ta), chromium (Cr), titanium (Ti), tungsten (W), molybdenum (Mo), and silicon (Si).

6. A method of manufacturing a semiconductor device comprising the steps of:
   forming a first conductive film over a substrate;
   patterning the first conductive film to form at least one first wiring line;
   forming a first insulating film over the first wiring line and the substrate;
   forming a first semiconductor island and a second semiconductor island, wherein the first semiconductor island is located over the first wiring line with the first insulating film interposed therebetween and the second semiconductor island does not overlap any portion of the first conductive film;
   forming a pair of first N-type impurity regions in the first semiconductor island with a first channel region therebetween;
   forming at least one second N-type impurity region between the first channel region and the first N-type impurity regions, wherein a concentration of an N-type impurity in the second N-type impurity region is lower than that in the first N-type impurity regions;
   forming a pair of P-type impurity regions in the second semiconductor island with a second channel region therebetween;
   forming a second insulating film over said the first semiconductor island and the second semiconductor island; and
   forming a second wiring line over the first channel region of the first semiconductor island and a third wiring line over the second channel region of the second semiconductor island,
   wherein there is an overlap between the first wiring line and the second N-type impurity region of the first semiconductor island and there is no overlap between the second wiring line and the second N-type impurity region, and
   wherein the first wiring line is electrically connected to the second wiring line.

7. The method of manufacturing the semiconductor device according to claim 6,
wherein the first conductive film comprises a material selected from the group consisting of tantalum (Ta), chromium (Cr), titanium (Ti), tungsten (W), molybdenum (Mo), and silicon (Si).

8. The method of manufacturing the semiconductor device according to claim 6,
wherein the second wiring line and the third wiring line are formed by patterning a second conductive film, the second conductive film comprising a material selected from the group consisting of tantalum (Ta), chromium (Cr), titanium (Ti), tungsten (W), molybdenum (Mo), and silicon (Si).

9. A method of manufacturing a semiconductor device comprising the steps of:
forming a first conductive film over a substrate;
patterning the first conductive film to form at least one first wiring line;
forming a first insulating film over the first wiring line and the substrate;
forming a first semiconductor island and a second semiconductor island, wherein the first semiconductor island is located over the first wiring line with the first insulating film interposed therebetween and the second semiconductor island does not overlap any portion of the first conductive film;
forming a pair of first N-type impurity regions in the first semiconductor island with a first channel region therebetween;
forming at least one second N-type impurity region between the first channel region and the first N-type impurity regions, wherein a concentration of an N-type impurity in the second N-type impurity region is lower than that in the first N-type impurity regions;
forming a pair of P-type impurity regions in the second semiconductor island with a second channel region therebetween;
forming a second insulating film over said the first semiconductor island and the second semiconductor island; and
forming a second wiring line over the first channel region of the first semiconductor island and a third wiring line over the second channel region of the second semiconductor island,
wherein the first wiring line extends beyond both side edges of the second wiring line.

10. The method of manufacturing the semiconductor device according to claim 9,
wherein the first conductive film comprises a material selected from the group consisting of tantalum (Ta), chromium (Cr), titanium (Ti), tungsten (W), molybdenum (Mo), and silicon (Si).

11. The method of manufacturing the semiconductor device according to claim 9,
wherein the second wiring line and the third wiring line are formed by patterning a second conductive layer, the conductive layer comprising a material selected from the group consisting of tantalum (Ta), chromium (Cr), titanium (Ti), tungsten (W), molybdenum (Mo), and silicon (Si).

12. A method of manufacturing a semiconductor device comprising the steps of:
forming a first conductive film over a substrate;
patterning the first conductive film to form at least one first wiring line;
forming a first insulating film over the first wiring line and the substrate;
forming a first semiconductor island and a second semiconductor island, wherein the first semiconductor island is located over the first wiring line with the first insulating film interposed therebetween and the second semiconductor island does not overlap any portion of the first conductive film;
forming a pair of first N-type impurity regions in the first semiconductor island with a first channel region therebetween;
forming at least one second N-type impurity region between the first channel region and the first N-type impurity regions, wherein a concentration of an N-type impurity in the second N-type impurity region is lower than that in the first N-type impurity regions;
forming a pair of P-type impurity regions in the second semiconductor island with a second channel region therebetween;
forming a second insulating film over the first semiconductor island and the second semiconductor island;
forming a second wiring line over the first channel region of the first semiconductor island and a third wiring line over the second channel region of the second semiconductor island;
forming a third insulating film over the second wiring line and the third wiring line; and
forming a pixel electrode over the third insulating film,
wherein the first wiring line is electrically floating, and
wherein the first wiring line extends beyond both side edges of the second wiring line.

13. The method of manufacturing the semiconductor device according to claim 12,
wherein the first conductive film comprises a material selected from the group consisting of tantalum (Ta), chromium (Cr), titanium (Ti), tungsten (W), molybdenum (Mo), and silicon (Si).

14. The method of manufacturing the semiconductor device according to claim 12,
wherein said the second wiring line and the third wiring line are formed by patterning a second conductive layer, the second conductive layer comprising a material selected from the group consisting of tantalum (Ta), chromium (Cr), titanium (Ti), tungsten (W), molybdenum (Mo), and silicon (Si).

15. A method of manufacturing a semiconductor device comprising the steps of:
forming a first conductive film over a substrate;
patterning the first conductive film to form at least one first wiring line;
forming a first insulating film over the first wiring line and the substrate;
forming a first semiconductor island and a second semiconductor island, wherein the first semiconductor island is located over the first wiring line with the first insulating film interposed therebetween and the second semiconductor island does not overlap any portion of the first conductive film;
forming a pair of first N-type impurity regions in the first semiconductor island with a first channel region therebetween;
forming at least one second N-type impurity region between the first channel region and the first N-type impurity regions, wherein a concentration of an N-type impurity in the second N-type impurity region is lower than that in the first N-type impurity regions;

forming a pair of P-type impurity regions in the second semiconductor island with a second channel region therebetween;

forming a second insulating film over the first semiconductor island and the second semiconductor island; and forming a second wiring line over the first channel region of the first semiconductor island and a third wiring line over the second channel region of the second semiconductor island, wherein the first wiring line extends beyond both side edges of the second wiring line and is connected to a fixed potential.

16. The method of manufacturing the semiconductor device according to claim 15, wherein the first conductive film comprises a material selected from the group consisting of tantalum (Ta), chromium (Cr), titanium (Ti), tungsten (W), molybdenum (Mo), and silicon (Si).

17. The method of manufacturing the semiconductor device according to claim 15, wherein the second wiring line and the third wiring line are formed by patterning a second conductive layer, the second conductive layer comprising a material selected from the group consisting of tantalum (Ta), chromium (Cr), titanium (Ti), tungsten (W), molybdenum (Mo), and silicon (Si).

18. A method of manufacturing a semiconductor device comprising the steps of:

forming a first conductive film over a substrate;

patterning said the first conductive film to form at least one first wiring line;

forming a first insulating film over the first wiring line and the substrate;

forming a first semiconductor island and a second semiconductor island, wherein the first semiconductor island is located over the first wiring line with the first insulating film interposed therebetween and the second semiconductor island does not overlap any portion of the first conductive film;

forming a second insulating film over the first semiconductor island and the second semiconductor island;

forming a second conductive film over the second insulating film;

first etching a portion of the second conductive film to form a second wiring line over the first semiconductor island while a portion of the conductive film over the second semiconductor island is not etched, wherein the first wiring line extends beyond side edges of the first semiconductor island;

first introducing an N-type impurity into the first semiconductor island at a first concentration in accordance with a pattern of the second wiring line, wherein the N-type impurity is prevented from being introduced into the second semiconductor island during the first introducing the N-type impurity;

second etching another portion of the second conductive film to form a third wiring line over the second semiconductor island after the first introducing of the N-type impurity;

introducing a P-type impurity into the second semiconductor island in accordance with a pattern of the third wiring line, wherein the P-type impurity is prevented from being introduced into the first semiconductor island during the introducing the P-type impurity;

forming a first resist mask and a second resist mask, wherein the first resist mask covers the second wiring line and extends beyond side edges of the second wiring line, and the second resist mask is formed over the third wiring line;

second introducing an N-type impurity into the first semiconductor island in accordance with the first resist mask and the second resist mask at a second concentration greater than the first concentration.

19. The method of manufacturing the semiconductor device according to claim 18, wherein the first conductive film comprises a material selected from the group consisting of tantalum (Ta), chromium (Cr), titanium (Ti), tungsten (W), molybdenum (Mo), and silicon (Si).

20. The method of manufacturing the semiconductor device according to claim 18, wherein the second conductive layer comprising a material selected from the group consisting of tantalum (Ta), chromium (Cr), titanium (Ti), tungsten (W), molybdenum (Mo), and silicon (Si).

* * * * *